(12) United States Patent
Periyannan et al.

(10) Patent No.: US 12,224,259 B2
(45) Date of Patent: Feb. 11, 2025

(54) CLAMPED SEMICONDUCTOR WAFERS AND SEMICONDUCTOR DEVICES

(71) Applicant: WESTERN DIGITAL TECHNOLOGIES, INC., San Jose, CA (US)

(72) Inventors: Kirubakaran Periyannan, Santa Clara, CA (US); Daniel Linnen, Naperville, IL (US); Jayavel Pachamuthu, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 423 days.

(21) Appl. No.: 17/718,021

(22) Filed: Apr. 11, 2022

(65) Prior Publication Data

US 2023/0326887 A1    Oct. 12, 2023

(51) Int. Cl.
*H01L 23/00* (2006.01)
*H01L 25/065* (2023.01)

(52) U.S. Cl.
CPC .............. *H01L 24/06* (2013.01); *H01L 24/05* (2013.01); *H01L 24/08* (2013.01); *H01L 25/0657* (2013.01); *H01L 2224/05557* (2013.01); *H01L 2224/06517* (2013.01); *H01L 2224/0807* (2013.01); *H01L 2224/08147* (2013.01); *H01L 2224/80345* (2013.01)

(58) Field of Classification Search
CPC ..... H01L 24/05; H01L 24/08; H01L 25/0657; H01L 2224/05557; H01L 2224/06517; H01L 2224/0807; H01L 2224/08147; H01L 2224/80345; H01L 2225/06506; H01L 2225/0651; H01L 2225/06562; H01L 2225/06568; H01L 2225/06586; H01L 2225/06593; H01L 25/18; H01L 25/50; H01L 24/80; H10B 80/00
See application file for complete search history.

(56) References Cited

U.S. PATENT DOCUMENTS

| | | | |
|---|---|---|---|
| 7,411,296 B2 | 8/2008 | Sahasrabudhe et al. | |
| 8,896,111 B2 | 11/2014 | Tanimoto et al. | |
| 10,991,444 B1 | 4/2021 | Bazarsky et al. | |
| 2003/0113976 A1* | 6/2003 | Hau-Riege | H01L 24/06 257/E21.705 |
| 2014/0054763 A1* | 2/2014 | Woychik | H01L 23/49811 257/737 |
| 2019/0115247 A1 | 4/2019 | Tong et al. | |
| 2023/0005868 A1* | 1/2023 | Chuang | H01L 24/05 |

FOREIGN PATENT DOCUMENTS

KR    20170116185 A    10/2017

* cited by examiner

*Primary Examiner* — Karen Kusumakar
(74) *Attorney, Agent, or Firm* — Pearl Cohen Zedek Latzer Baratz LLP

(57) ABSTRACT

Clamped semiconductor wafers and clamped semiconductor devices include reservoirs filled with a flowable metal which hardens to allow the wafers/devices to be shipped or stored. The hardened metal may also be reflowed to a liquid to allow clamping of the semiconductor wafers together and to allow clamping of the semiconductor packages together. The flowable metal may be filled into the reservoirs as a liquid or paste. Thereafter, the flowable metal may be cooled to harden the flowable metal into a clamping member.

19 Claims, 15 Drawing Sheets

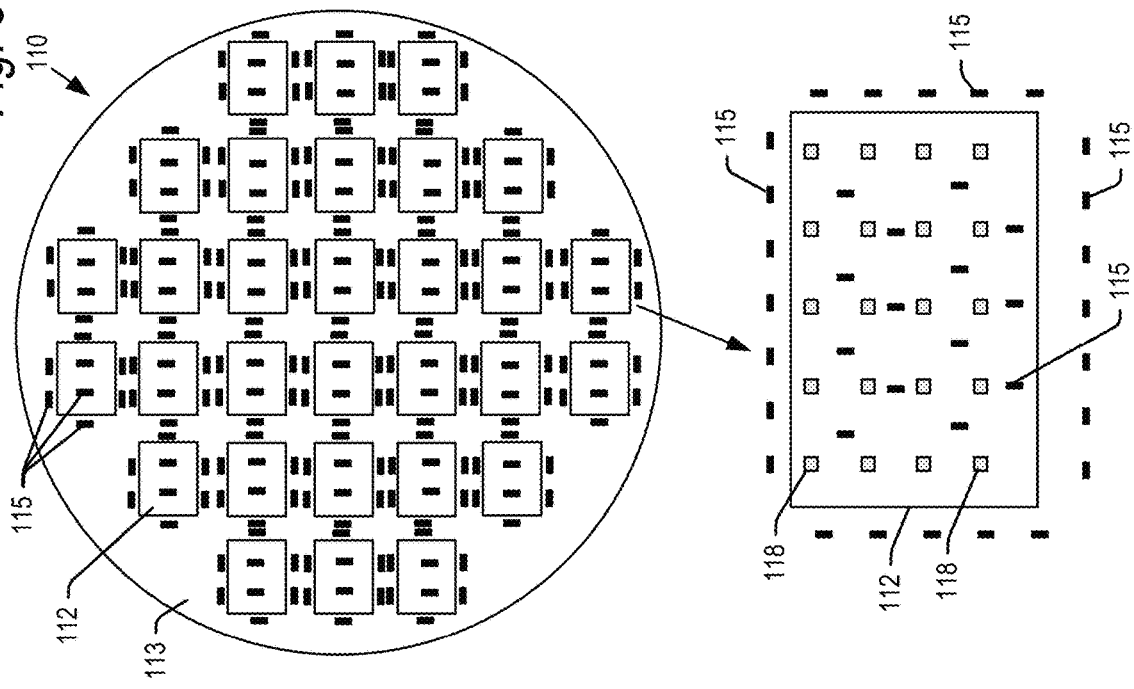
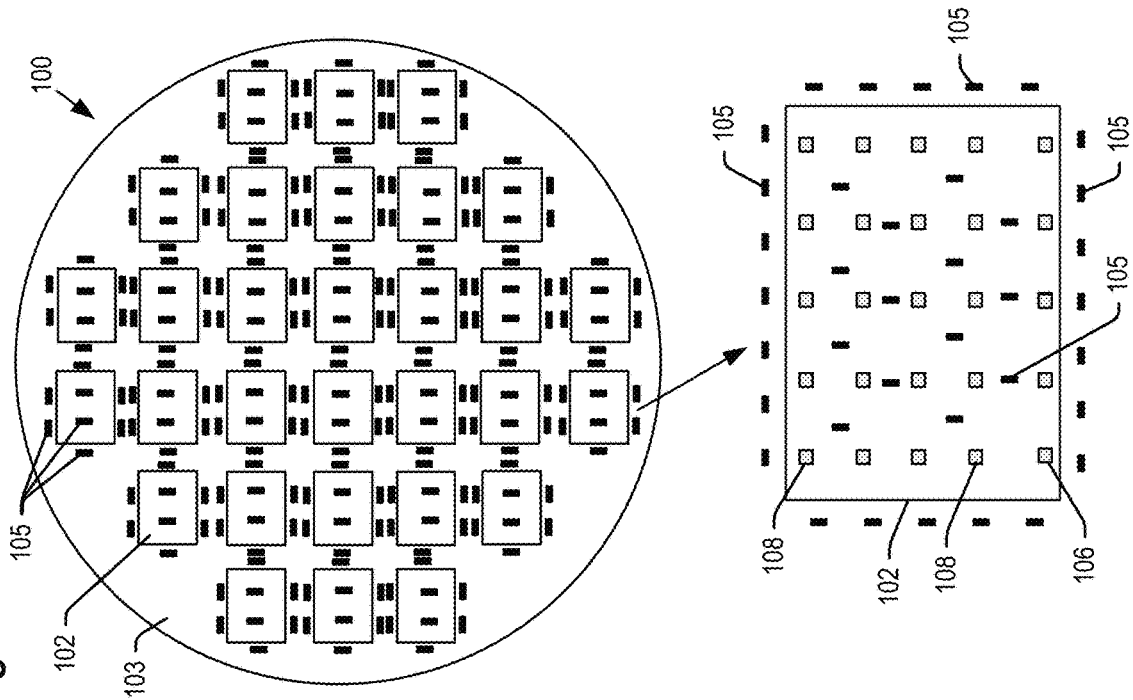

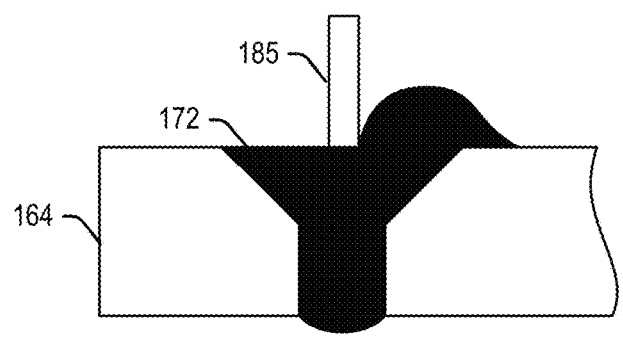
Fig. 26
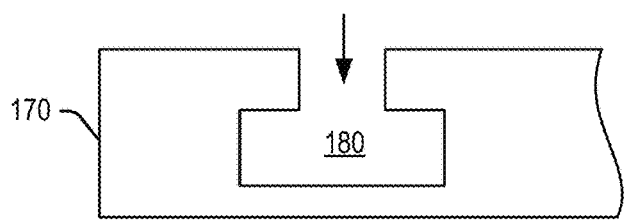
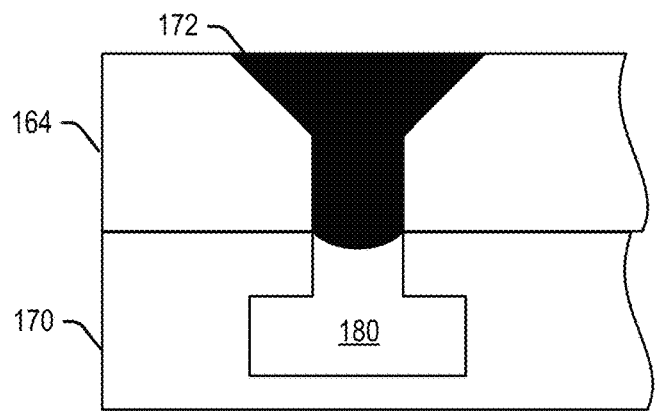
Fig. 27
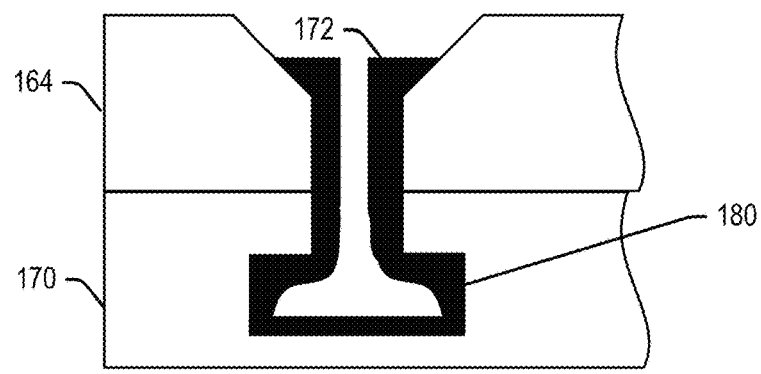
Fig. 28

CLAMPED SEMICONDUCTOR WAFERS AND SEMICONDUCTOR DEVICES

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and solid state drives.

Recently, ultra high density memory devices have been proposed using a 3D stacked memory array structure having strings of memory cells formed into layers. One such storage device is sometimes referred to as a Bit Cost Scalable (BiCS) architecture. In addition to the layered memory cells, 3D memory devices include a logic circuit for controlling read/write to the memory cells. The logic circuit, often fabricated using complementary metal-oxide-semiconductor (CMOS) technology, may typically be formed beneath stacked memory layers within a semiconductor wafer.

Given the difficulties in fabricating the memory array structure together with the CMOS logic circuits, it is now known to fabricate these circuits on different wafers, and then to affix the wafers to form an integrated memory module. While some methods of affixing the respective wafers together are known, such as Cu—Cu bonding, these methods have shortcomings. For example, it is occasionally necessary to separate affixed wafers or dies to rework a component, and thereafter, reattach the wafers or dies. Conventional affixation methods do not satisfactorily allow for this process.

Once semiconductor dies (BICS 3D memory dies or otherwise) are diced from a wafer, they may be mounted on a substrate and used as a packaged memory device. At times, it may also be desirable to stack multiple such substrates and/or packaged memory devices together. Again, conventional methods of affixing substrates to each other have shortcomings, such as for example not allowing for separation, rework and reattachment of substrates.

DESCRIPTION OF THE DRAWINGS

FIG. 2 is a top view of a first semiconductor wafer, and a first semiconductor die therefrom, according to embodiments of the present technology.

FIG. 3 is a top view of a second semiconductor wafer, and a second semiconductor die therefrom, according to embodiments of the present technology.

FIG. 26 is an enlarged cross-sectional edge view of reservoirs for clamping a semiconductor device to an electronic component such as a printed circuit board according to embodiments of the present technology.

FIG. 27 is an enlarged cross-sectional edge view of reservoirs positioned adjacent to each other in preparation for clamping a semiconductor device to an electronic component such as a printed circuit board according to embodiments of the present technology.

FIG. 28 is an enlarged cross-sectional edge view of reservoirs clamping a semiconductor device to an electronic component such as a printed circuit board according to embodiments of the present technology.

DETAILED DESCRIPTION

Figure 1:
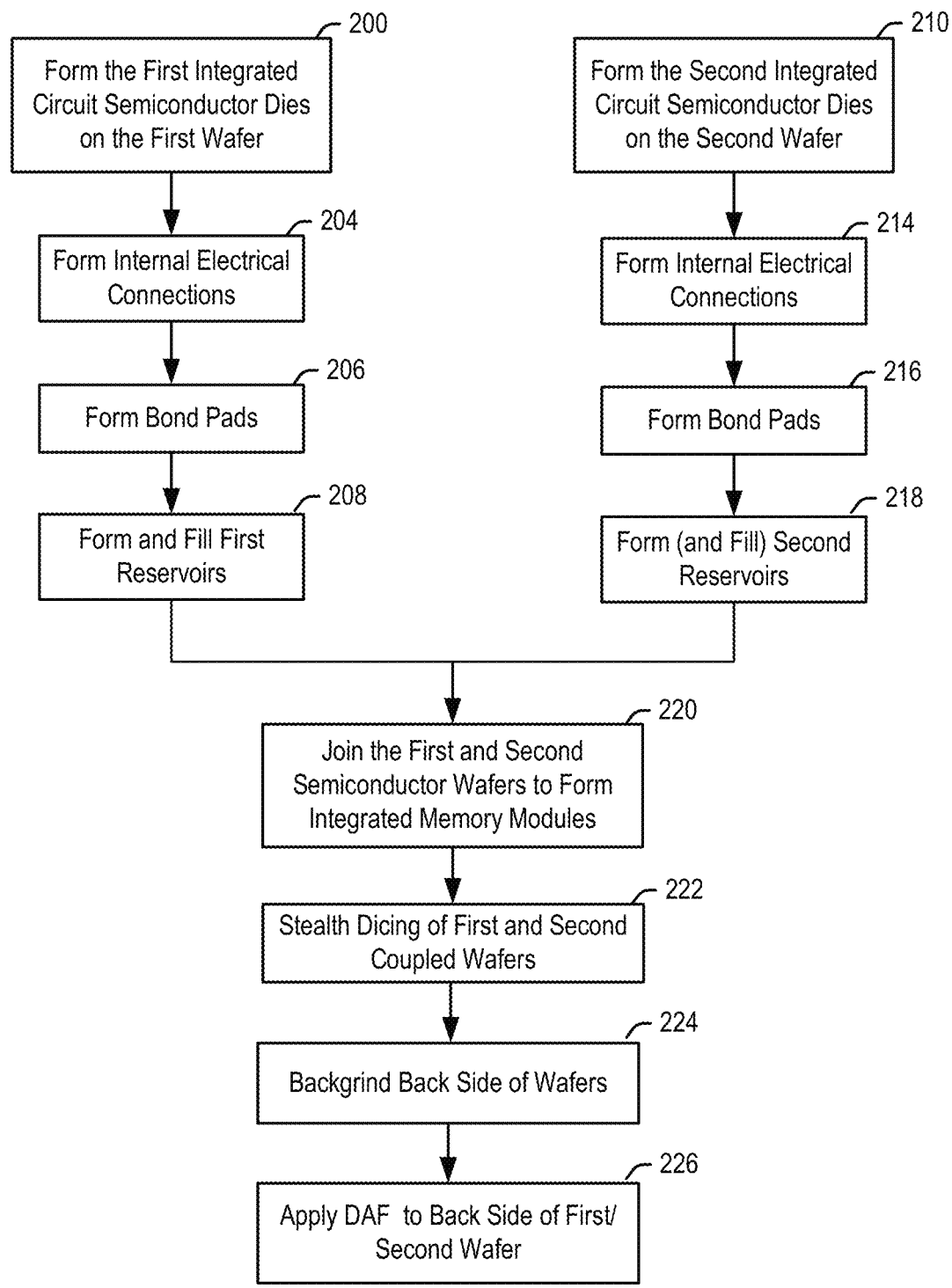
FIG. 1 is a flowchart for forming a semiconductor device according to embodiments of the present technology.
Figure 5:
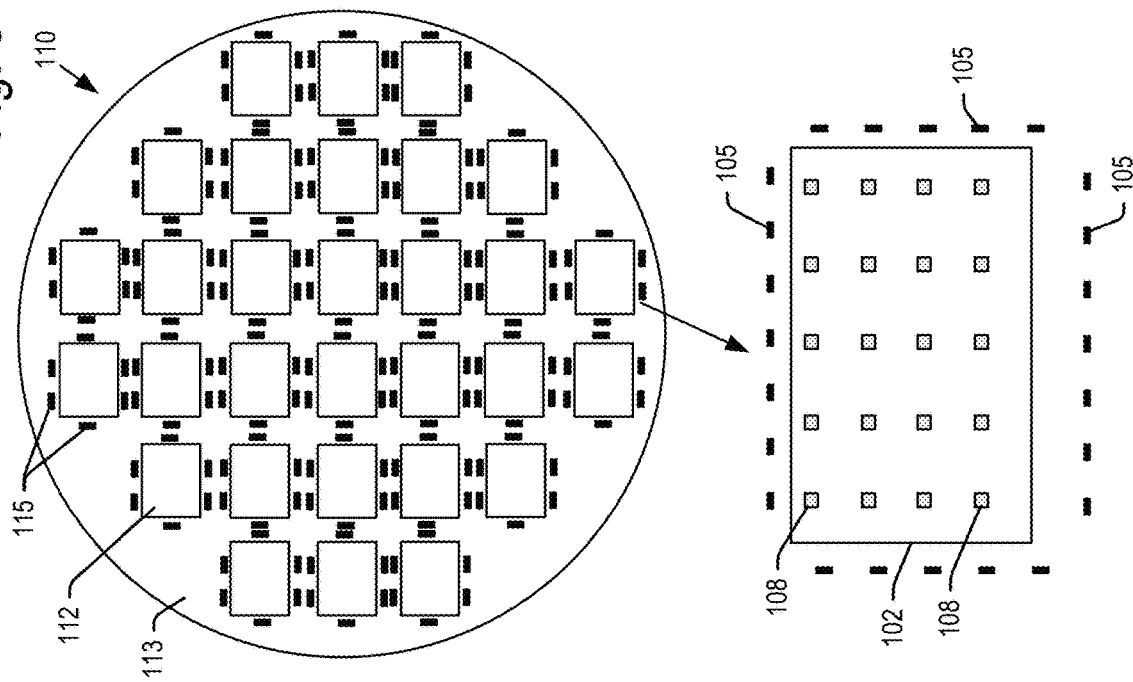
FIG. 5 is a top view of a second semiconductor wafer, and a second semiconductor die therefrom, according to alternative embodiments of the present technology.

The present technology will now be described with reference to the figures, which in embodiments, relate to clamped semiconductor wafers and clamped semiconductor devices, and methods of forming same. In one aspect of the present technology, two or more semiconductor wafers may be clamped together by forming reservoirs at corresponding positions on adjoining wafers. The reservoirs on one or both of the wafers to be clamped may be filled with a flowable metal as a paste or as a liquid which is subsequently cooled and hardened. Thereafter, the wafers may be clamped together by joining them and heating the wafers. The heated metal will reflow and cross the interface between adjoining wafers. When the wafers are again cooled, the metal hardens to clamp the wafers together.

In addition to joining the wafers, the contraction of the metal upon cooling ensures a tight connection and prevents warping of one or both wafers away from each other. In embodiments, one wafer may be formed with memory array structures and the other wafer may be formed with CMOS logic circuits to form wafers of integrated memory modules. However, other types of semiconductor wafers may be jointed together.

In a second aspect of the present technology, two or more semiconductor devices may be clamped together. Reservoirs or openings may be formed in corresponding positions on the substrates of a pair of semiconductor devices. The reservoirs/openings in the substrates of one or both semiconductor devices to be joined may be filled with a flowable metal as a paste or a liquid which subsequently cools and hardens. Thereafter, the semiconductor devices may be clamped together by joining them and heating. The heated metal will reflow and cross the interface between adjoining semiconductor devices. When the semiconductor devices are again cooled, the metal hardens to clamp the devices together. As with the joined wafers, the cooling metal will contract to ensure a tight connection between the semiconductor devices.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±1.5 mm, or alternatively, ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

A first embodiment of the present technology will now be explained with reference to the flowchart of FIG. 1, and the views of FIGS. 2-18. In step 200, a first semiconductor wafer 100 may be processed into a number of first semiconductor dies 102 as shown in FIG. 2. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The semiconductor wafer 100 may be cut from the ingot and polished on both the first major planar surface 103, and second major planar surface 104 (FIG. 6) opposite surface 103, to provide smooth surfaces. The first major surface 103 may undergo various processing steps to divide the wafer 100 into the respective first semiconductor dies 102, and to form integrated circuits of the respective first semiconductor dies 102 on and/or in the first major surface 103.

Figure 6:
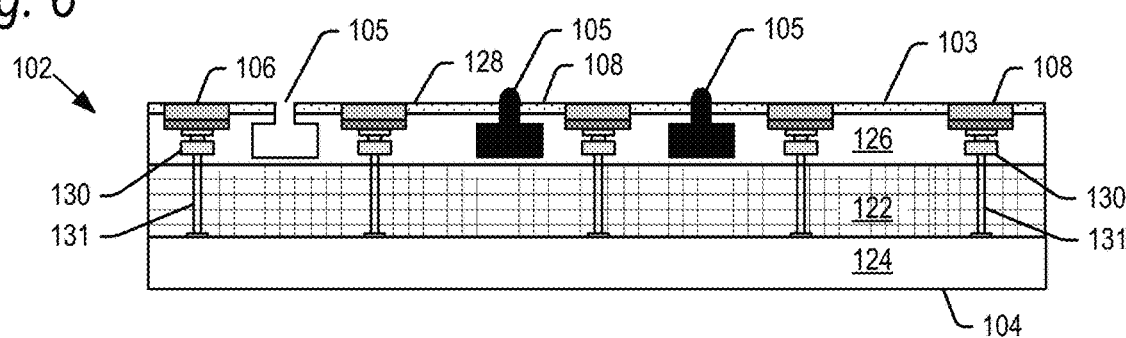
FIG. 6 is a cross-sectional edge view of a first semiconductor die according to embodiments of the present technology.

In one example, the first semiconductor dies 102 may each be processed to include integrated circuit memory cell array 122 formed in a dielectric substrate including layers 124 and 126 as shown in the cross-sectional edge view of FIG. 6. In embodiments, the memory cell array 122 may be formed as a 3D stacked memory structure having strings of memory cells formed into layers. However, it is understood that the first semiconductor dies 102 may be processed to include integrated circuits other than a 3D stacked memory structure. A passivation layer 128 may be formed on top of the upper dielectric film layer 126.

After formation of the memory cell array 122, internal electrical connections may be formed within the first semiconductor dies 102 in step 204. The internal electrical connections may include multiple layers of metal interconnects 130 and vias 131 formed sequentially through layers of the dielectric film 126. As is known in the art, the metal interconnects 130, vias 131 and dielectric film layers 126 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 130 may be formed of a variety of electrically conductive metals including for example copper alloys as is known in the art, and the vias 131 may be lined and/or filled with a variety of electrically conductive metals including for example tungsten and copper alloys as is known in the art. The dielectric layers 124, 126 may be formed of Silicon Dioxide.

In step 208, bond pads may be formed on the major planar surface 103 of the first semiconductor dies 102. As shown in FIGS. 2 and 6, these bond pads may include a single row of bond pads 106 and multiple rows of flip-chip bond pads 108. As explained below, the flip-chip bond pads 108 are provided for flip-chip bonding to a like pattern of bond pads 118 on a surface of a second semiconductor die 112. As is also explained below, the bond pads 106 are provided for transferring signals between the pair of semiconductor dies 102, 112 and a host device.

FIG. 2 shows semiconductor dies 102 on wafer 100, and bond pads 106, 108 in a grid pattern on one of the semiconductor dies 102. The number of first semiconductor dies 102 shown on wafer 100 in FIG. 2 is for illustrative purposes, and wafer 100 may include more first semiconductor dies 102 than are shown in further embodiments. Similarly, the pattern of bond pads 106, 108, as well as the number of bond pads 106, 108, on the first semiconductor dies 102 are shown for illustrative purposes. Each of the first dies 102 may include more bond pads 106, 108 than are shown in further embodiments, and may include various other patterns of bond pads 106, 108.

In accordance with aspects of the present technology shown for example in FIGS. 2 and 6, reservoirs 105 may also be formed and filled in the wafer 100 in step 208. These reservoirs may be formed through the first major planar surface 103 into the dielectric layer 126. In embodiments, the reservoirs 105 do not extend into the integrated circuit memory array layers, but the reservoirs can in further embodiments. In one example, each reservoir may be formed generally in a "T"-shape, having a wider base section and a narrower neck section at the surface 103. However, as explained below, the reservoirs 105 may have different shapes and configurations in different embodiments.

Once formed, these reservoirs may be filled with a flowable metal. FIG. 6 shows one reservoir 105 unfilled and the remaining reservoirs filled for ease of understanding, but each reservoir 105 in wafer 100 may be filled. As used herein, a flowable metal is one which can be heated or otherwise energized into a liquid state where the metal can flow, and which can be cooled or otherwise deenergized into a solid state where the metal is solid and structurally rigid. The flowable metal may also have an intermediate, paste-like state where it is malleable. In further embodiments, the flowable metal is one which can be converted between the liquid state and solid state multiple times. In one example, the flowable metal could be copper or solder mixtures including metals such as lead, tin, and/or indium, but other soft metals can be used. In general, the metal selected for the flowable metal is one which has a melting point lower than the melting points of the metal interconnects 130, vias 131, bond pads 106, 108 and other components in the wafer 100.

As with the metal interconnects 130 and vias 131, the reservoirs 105 may be formed a layer at a time using photolithographic and thin-film deposition processes. Thus, the wider base portion of the reservoirs 105 may be formed first, and the narrower surface portions of the reservoirs 105 may be formed second. The photolithographic processes may include for example pattern definition, plasma, chemical or dry etching and polishing.

Once formed, the reservoirs 105 may be plated with a plating material such as for example tungsten or copper alloys. The thin-film deposition processes for plating reservoirs 105 may include for example sputtering and/or chemical vapor deposition. The plating of reservoirs 105 may be omitted in further embodiments. The formation and plating of the reservoirs 105 may be done in unison with the formation of the metal interconnects 130 and vias 131, though these processes may be performed separately in further embodiments.

Once formed and (where applicable) plated, the reservoirs 105 may be filled with the flowable metal. The flowable metal may be deposited using various deposition processes including for example chemical vapor deposition and atomic layer deposition. Other deposition processes are possible. Instead of filling the reservoirs entirely by a deposition process, the deposition process may be used to form a layer of the flowable metal in a reservoir 105, and thereafter, the rest of the reservoir may be filled using a plating process which plates the flowable metal into the reservoir.

In a further embodiment, instead of or in addition to the above processes, the reservoirs 105 may be filled with the flowable metal using pressure to force the flowable metal into the reservoirs. In this example, the flowable metal may be applied as a liquid or a paste between the liquid and solid state. Such flowable metals may then be forced into the reservoirs 105 using for example screen or stencil printing techniques. In a further example, the flowable metal may be forced into the reservoirs in a pressurized gaseous form, and then the wafer may be heated to decompose the gas into the pure flowable metal. Any metal which escapes the reservoir onto the major surface 103 could then be polished or etched away. While the figures show the reservoirs 105 completely filled with the flowable metal, voids without flowable metal may exist in a reservoir 105 without impacting the function of the reservoirs as explained below.

In examples, a small portion of flowable metal may protrude out of the reservoirs, above the major planar surface 103. The small portion, referred to herein as a crown, of flowable metal is used to align the reservoirs 105 in the first wafer 100 with corresponding reservoirs in a second wafer as explained below.

As seen for example in FIG. 2, the reservoirs 105 may surround each semiconductor die 102 on wafer 100, and some reservoirs 105 may also be formed within the footprint of each semiconductor die 102. Where reservoirs 105 are formed within the footprint of the dies 102, they may be formed at positions in the dielectric layer 126 that do not interfere with the positions the metal interconnects 130, vias 131 and/or bond pads 106, 108, as shown for example in FIG. 6.

As explained below, after fabrication of the dies 102 on wafer 100, the wafer may be diced for example by stealth laser dicing. Such dicing techniques may leave reservoirs 105 surrounding each die 102 after dicing. In particular, the memory array 122 may be formed in an active area of the dies 102. Once diced from the wafer as explained below, there may be a border surrounding the active area of the dies. The reservoirs 105 may be formed in this border. However, in further embodiments, at least some of the reservoirs 105 surrounding the semiconductor dies 102 may be removed when the wafer 100 is diced. In such embodiments, the reservoirs 105 within the footprint of the semiconductor dies remain.

Figure 4:
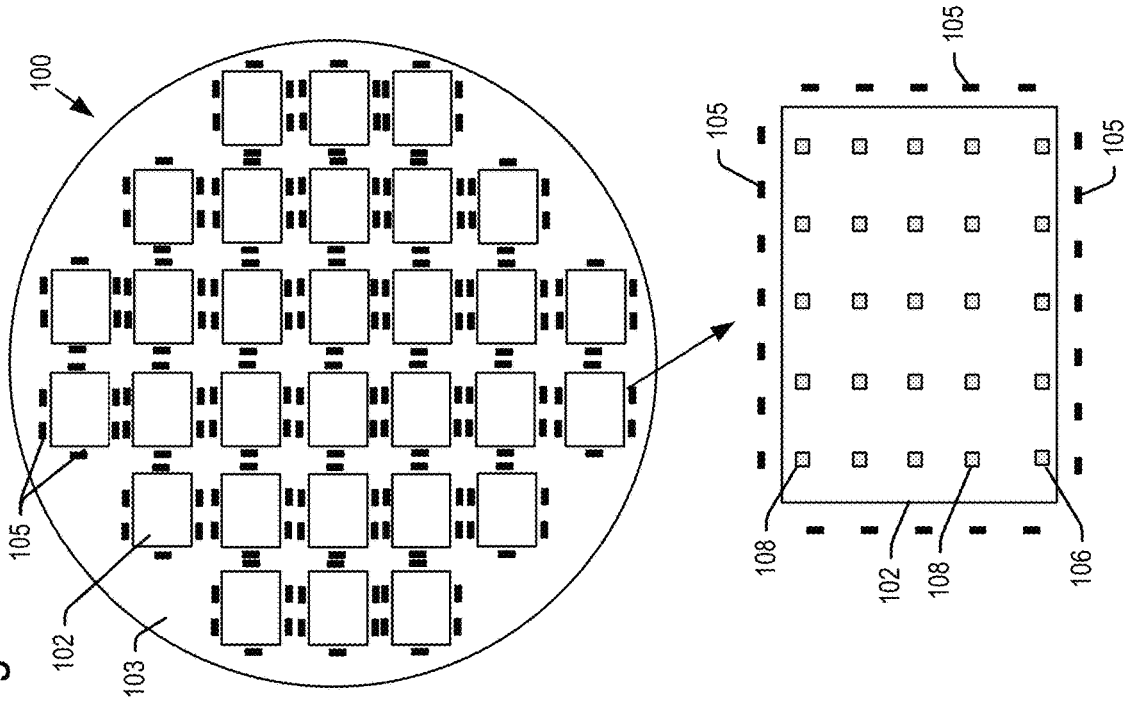
FIG. 4 is a top view of a first semiconductor wafer, and a first semiconductor die therefrom, according to alternative embodiments of the present technology.

In further embodiments, the reservoirs 105 may be formed solely in the kerf width between the semiconductor dies in wafer 100. Such an embodiment is shown in FIG. 4. This embodiment may be used where for example the reservoirs remain around the semiconductor dies 102 after dicing. This embodiment may also be used for example where the wafers are used as a memory device as a whole without dicing, such as for example as a solid state drive (SSD) in a datacenter.

However, it is understood that the pattern and number of reservoirs 105 shown in FIGS. 2, 4 and 6 are by way of example only. Wafer 100 may have other numbers of reservoirs and other patterns of reservoirs, either inside and outside dies 102 or solely around the outside of dies 102.

Before, after or in parallel with the formation of the first semiconductor dies 102 and reservoirs 105 on wafer 100, a second semiconductor wafer 110 may be processed to include a number of second semiconductor dies 112 and reservoirs 115 in steps 210-218 as shown in FIG. 3. The semiconductor wafer 110 may start as an ingot of monocrystalline silicon grown according to either a CZ, FZ or other process. The second semiconductor wafer 110 may be cut and polished on both the first major surface 113, and second major surface 114 (FIG. 7) opposite surface 113, to provide smooth surfaces. The first major surface 113 may undergo various processing steps to divide the second wafer 110 into the respective second semiconductor dies 112, and to form integrated circuits of the respective second semiconductor dies 112 on and/or in the first major surface 113.

Figure 7:
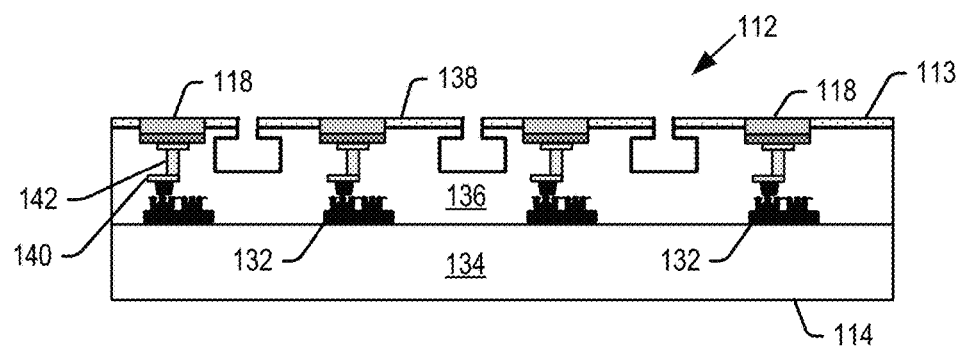
FIG. 7 is a cross-sectional edge view of a second semiconductor die according to embodiments of the present technology.

In one embodiment, the second semiconductor dies 112 may be processed to include integrated circuits 132 formed in a dielectric substrate including layers 134 and 136 as shown in the cross-sectional edge view of FIG. 7. Integrated circuits 132 may be configured as logic circuits to control read/write operations for one or more integrated memory cell arrays. The logic circuits may be fabricated using CMOS technology, though the logic circuits may be fabricated using other technologies in further embodiments. The second semiconductor dies 112 may include other and/or additional integrated circuits in further embodiments. A passivation layer 138 may be formed on top of the upper dielectric film layer 136.

After formation of the integrated circuits 132, internal electrical connections may be formed within the second semiconductor die 112 in step 214. The internal electrical connections may include multiple layers of metal interconnects 140 and vias 142 formed sequentially through layers of the dielectric film 136. The metal interconnects 140 and vias 142 may be formed of the same materials and in similar processes as interconnects 130 and vias 131 described above (though in different patterns).

In step 218, bond pads may be formed on the major planar surface 113 of the second semiconductor dies 112. As shown in FIGS. 3 and 7, these bond pads may include flip-chip bond pads 118. The bond pads 118 may match the bond pads 108 in pattern, size, pitch and number. The bond pads 118 may be formed of the same materials and in the same manner as bond pads 108 on the first semiconductor dies 102 described above. The integrated circuits 132 of the second semiconductor dies 112 may be electrically connected to the bond pads 118 by the metal interconnects 140 and vias 142.

FIG. 3 shows the second semiconductor dies 112 on wafer 110, and a grid pattern of bond pads 118 on one of the second semiconductor dies 112. The number of second semiconductor dies 112 shown on wafer 110 in FIG. 3 is for illustrative purposes, and wafer 110 may include more second semiconductor dies 112 than are shown in further embodiments. Similarly, the pattern of bond pads 118, as well as the number of bond pads 118, on the second semiconductor die 112 are shown for illustrative purposes. Each second die 112 may include more bond pads 118 than are shown in further embodiments, and may include various other patterns of bond pads 118, matching the pattern of bond pads 108 on first dies 102.

In accordance with aspects of the present technology shown for example in FIGS. 3 and 7, reservoirs 115 may also be formed in the wafer 110 in step 218. These reservoirs may be formed through the first major planar surface 113 into the dielectric layer 136. In embodiments, reservoirs 115 do not extend into the layers including the CMOS circuitry, but they may in further embodiments.

The positions of reservoirs 105 and 115 may be mapped to corresponding positions so that, when one of the wafers is flipped over and positioned over the other, the positions of the reservoirs 105 and 115 align with each other. As noted, the positions of the reservoirs 115 is by way of example only, and may vary in further embodiments. In the embodiment shown in FIGS. 3 and 7, the reservoirs are provided around the periphery of dies 112 and within the footprint of dies 112. In the alternative embodiment of FIG. 5, the reservoirs are provided only around the periphery of dies 112 and not within the footprint of dies 112.

In one example, the reservoirs 115 may have the same shapes as reservoirs 105, e.g., a generally "T"-shape, wider at its base and narrower at the surface 113. The reservoirs 115 may have different shapes which are the same as or different from reservoirs 105 in further embodiments. The reservoirs 115 may be formed in the same manner as described above for reservoirs 105. In the embodiment shown in FIGS. 7 and 8, the reservoirs 115 are not filled. The reservoirs 115 may or may not be plated.

Once the fabrication of first and second semiconductor wafers 100, 110 is complete, the first and second semiconductor wafers may be affixed to each other in step 220. In accordance with aspects of the present technology, this is accomplished by clamping the wafers 100 and 110 using reservoirs 105 and 115. As used herein, clamping refers to the stapling, joining, bonding, anchoring, stitching or otherwise affixing of components by the flowable metal within adjoining reservoirs of the components.

In the embodiments described above, the flowable metal fills the reservoirs 105. Where the flowable metal is applied to the reservoirs 105, the flowable liquid may be hardened by cooling, or otherwise cured to a solid. Where the flowable metal is applied as a paste, it may also be hardened by cooling, drying or otherwise cured to a solid. With the flowable metal in the reservoirs 105 in a hardened state, the wafer 100 may be shipped by itself and/or stored, and thereafter affixed to the second wafer 110. In this example, the flowable liquid is hardened in the first wafer 100, brought together with the second wafer 110, and then the flowable liquid is again converted to a flowable form where it flows from reservoirs 105 into reservoirs 115. Thereafter, the flowable metal is hardened again. In a further example, the flowable metal is put into reservoirs 105, the wafers 100 and 110 are brought together, the flowable metal flows from reservoirs 105 into reservoirs 115 and the flowable metal is hardened. In such an example, the flowable metal may be hardened for the first time when the wafers 100 and 110 are clamped together.

Where the flowable metal is initially a liquid, it may be hardened by cooling or otherwise cured, heated back into a liquid to join or separate the wafers, and then hardened back into a solid. This conversion of the flowable metal between a liquid and a solid may occur multiple times. Where the flowable metal is initially a paste, it may be hardened by cooling, drying or otherwise cured. Thereafter, the hardened material may be converted to a liquid metal for example by heating the flowable metal to evaporate the solvents which aided in making the initial paste. Thereafter, the conversion of the flowable metal between a liquid and a solid may occur multiple times.

Figure 8:
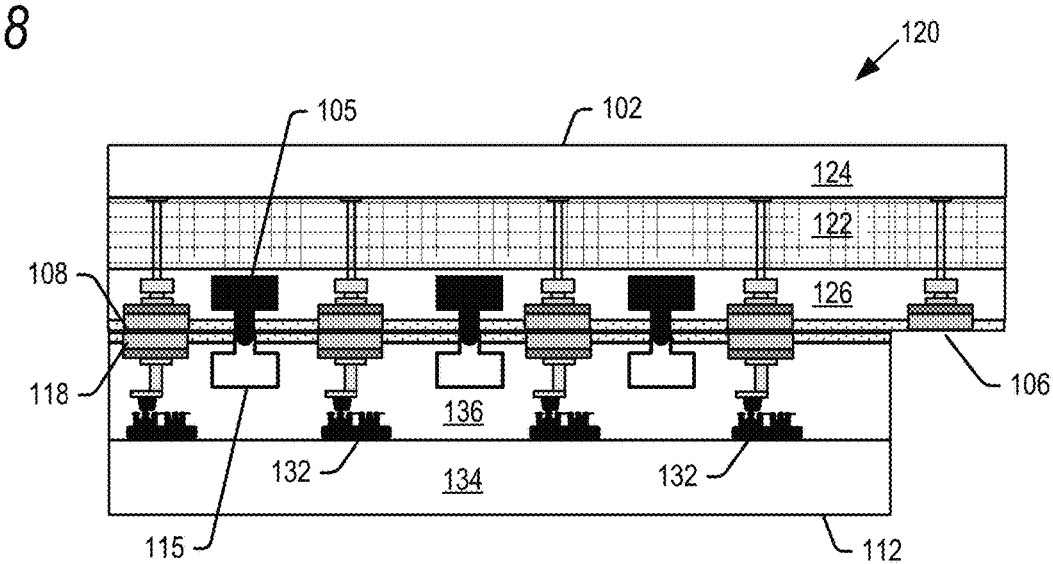
FIG. 8 is a cross-sectional edge view of an integrated memory module including a first semiconductor die to be clamped to a second semiconductor die according to embodiments of the present technology.

In order to clamp wafers 100 and 110 together, one of the wafers, e.g., wafer 100, maybe flipped over and positioned on top of wafer 110 so that the major surfaces 103 and 113 lie adjacent to each other and the reservoirs 105 and 115 align with each other as shown in FIG. 8. The crown in the flowable metal in reservoirs 105 help align the reservoirs 105 to the reservoirs 115. As indicated in FIG. 8, the size of semiconductor dies 112 may be slightly smaller than the size of semiconductor dies 102, so that the bond pads 106 on dies 102 are left uncovered. However, the patterns of reservoirs 105 and 115 may be the same in each of the wafers 100 and 110.

Figure 9:
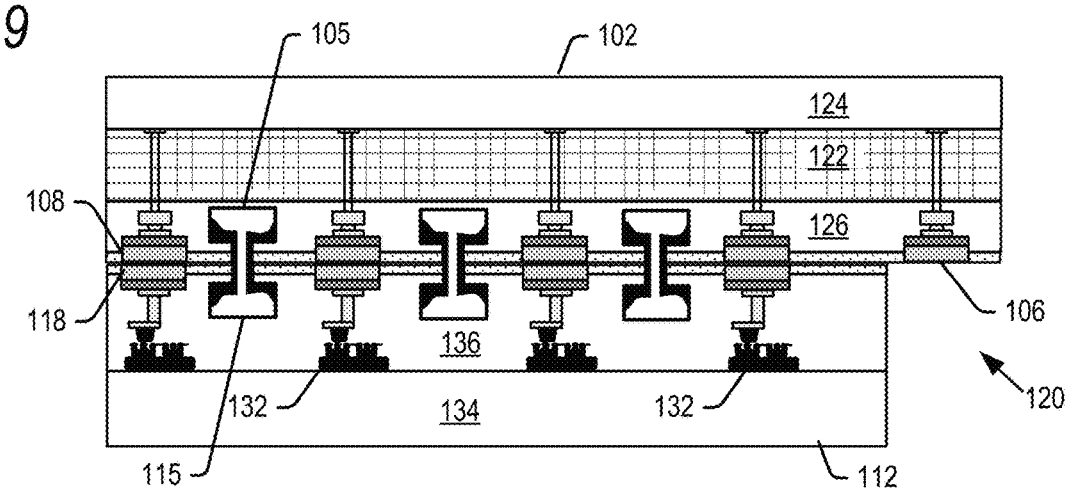
FIG. 9 is a cross-sectional edge view of an integrated memory module including a first semiconductor die clamped to a second semiconductor die according to embodiments of the present technology.

Once the wafers 100, 110 are positioned adjacent to each other as shown in FIG. 8, the wafers may be heated to alter the state of the flowable metal in reservoirs 105 from a solid or paste to a liquid. At this point, the flowable metal flows from reservoirs 105 into reservoirs 115 as shown in FIG. 9. The flowable liquid may flow into reservoirs 115 as a result of capillary action and/or gravity. Once the flowable metal has flowed into reservoirs 115, the wafers may be cooled and the flowable metal in the pairs of reservoirs 105, 115 hardens. At this point, the hardened metal in each pair of adjacent reservoirs forms a clamping member clamping the wafers 100, 110 together.

The configuration of the flowed and hardened metal shown in FIG. 9 is by way of example only, and may be different in further examples. However, in general, a portion of the flowed and hardened metal remains in the enlarged base part of reservoirs 105, a portion of the flowed and hardened metal has entered the enlarged base part of reservoirs 115, and a portion of the flowed and hardened metal remains in the narrower surface portions of reservoirs 105, 115. Thus, the hardened metal in the reservoirs 105, 115 bears against non-vertical surfaces of the reservoirs to firmly clamp the wafers 100, 110 and semiconductor dies 102, 112 together. Moreover, as the flowed metal cools, it contracts. This ensures a strong clamping force at the interface between wafers 100 and 110. This strong clamping force ensures the wafers and dies are held together tightly, and prevents warping of the wafers and/or dies away from each other which can otherwise occur in conventional affixation techniques.

In the embodiments described above, reservoirs 105 in wafer 100 have the flowable metal which flows into empty reservoirs 115 in wafer 110. In further embodiments, this may be reversed, so that reservoirs 115 in wafer 110 have the flowable metal which flows into empty reservoirs 105 in wafer 100.

Figure 10:
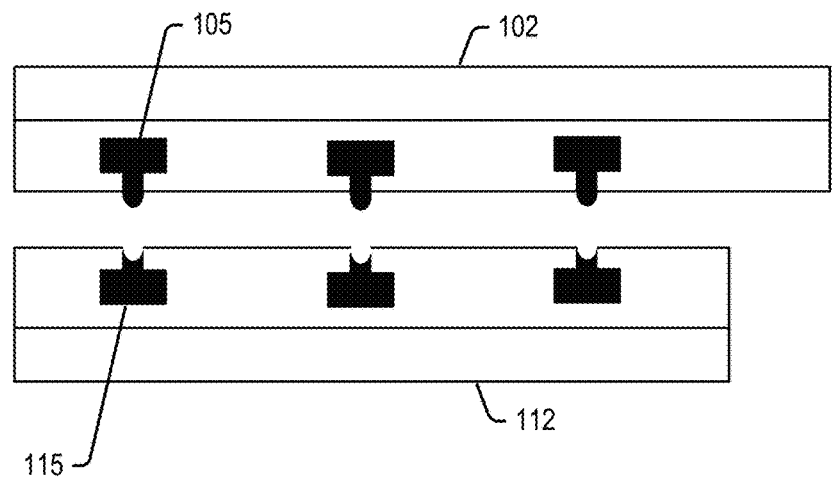
FIG. 10 is a cross-sectional edge view of a first semiconductor die to be clamped to a second semiconductor die according to alternative embodiments of the present technology.
Figure 11:
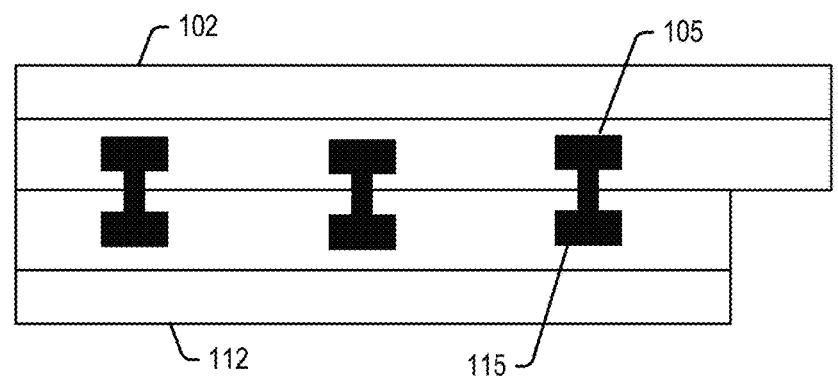
FIG. 11 is a cross-sectional edge view of a first semiconductor die clamped to a second semiconductor die according to alternative embodiments of the present technology.
Figure 12:
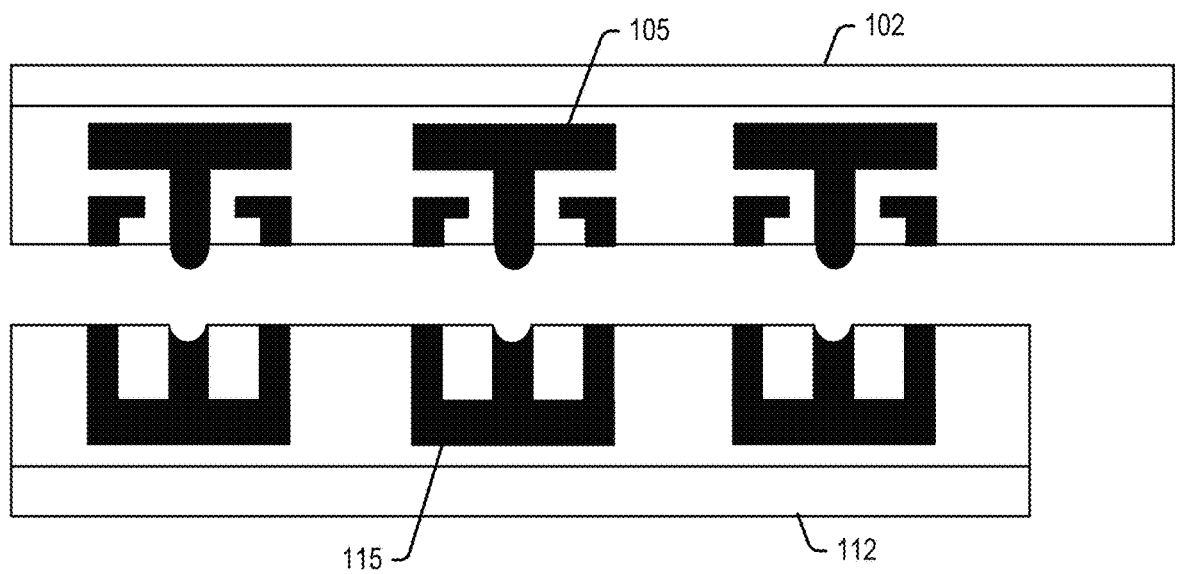
FIGS. 12-15 are cross-sectional edge views of first and second semiconductor dies including reservoirs according to alternative embodiments of the present technology.
Figure 13:
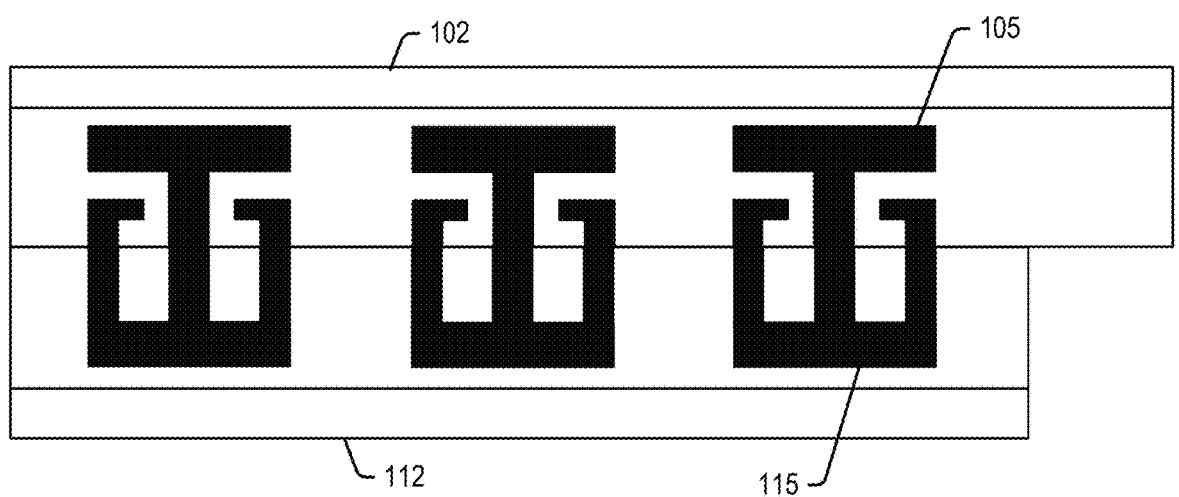
Figure 14:
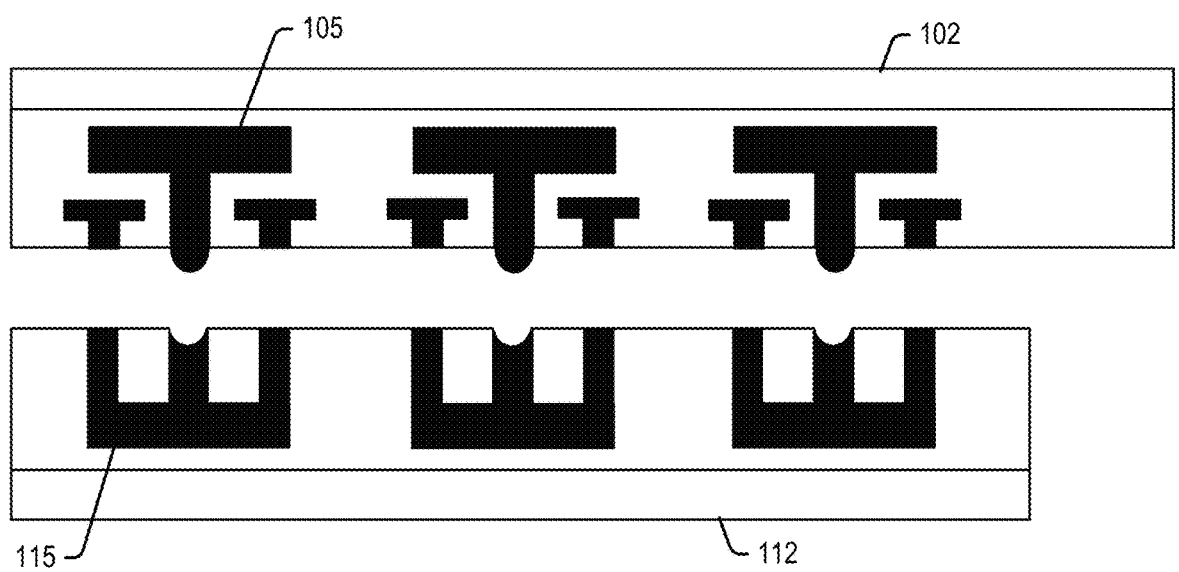
Figure 15:
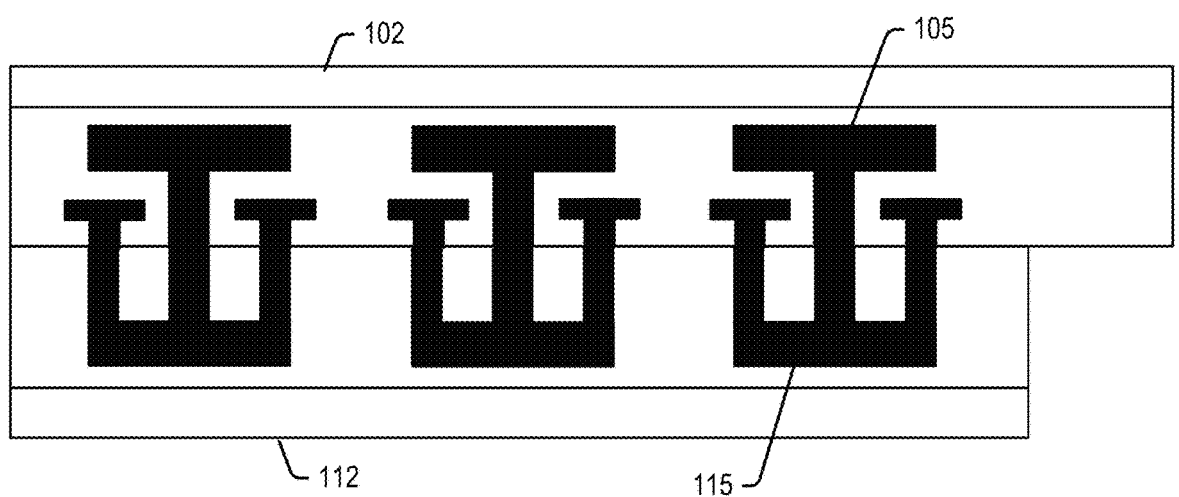
Figure 16:
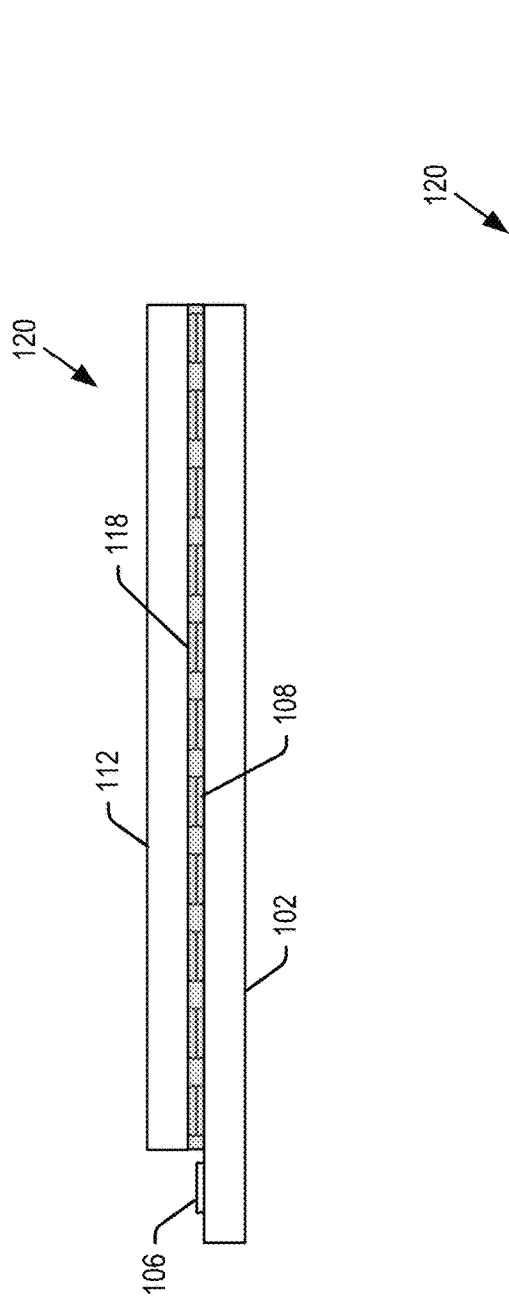
FIGS. 16 and 17 are edge and perspective views showing an integrated memory module according to embodiments of the present technology.
Figure 17:
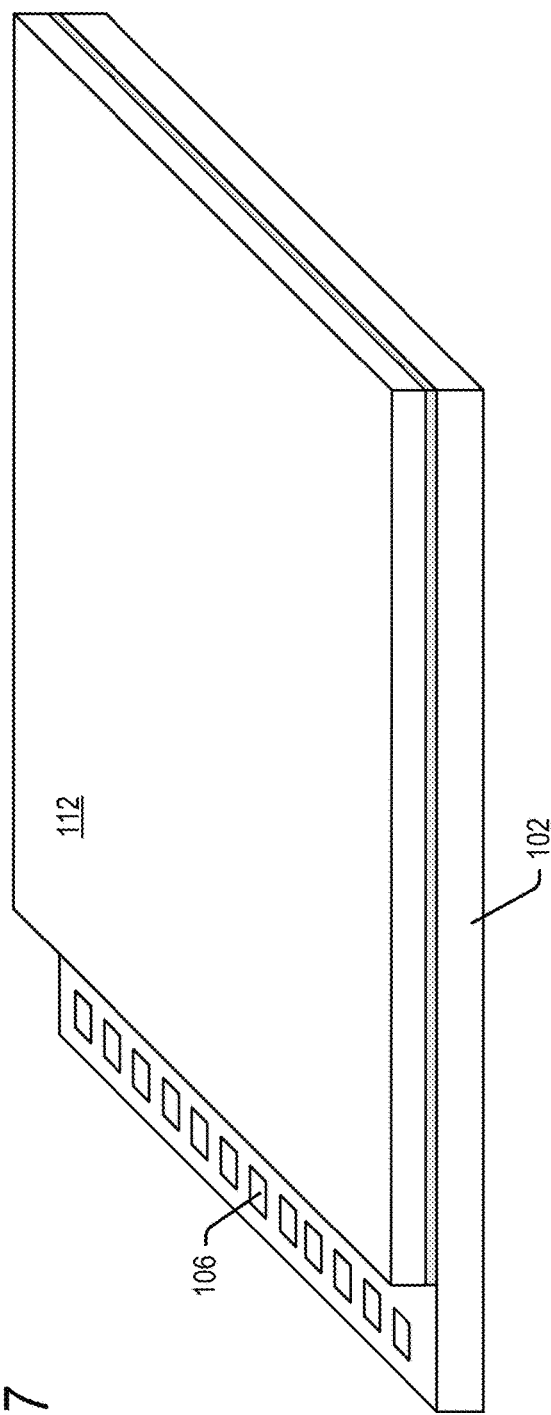

FIGS. 10 and 11 are simplified views of dies 102 and 112 from wafers 100 and 110 including reservoirs according to an alternative embodiment of the present technology. In particular, in this embodiment, reservoirs 115 may also be at least partially filled with the flowable metal used in reservoirs 105. The flowable metal may be added into reservoirs 115 by any of the above-described methods for adding the flowable metal to reservoirs 105. In this embodiment, the flowable metal may be placed in reservoirs 105 and 115 in the wafers 100 and 110 and the flowable metal may then be hardened to allow the wafers 100, 110 to be shipped or stored. Thereafter, the wafers 100, 110 may be brought together, the flowable metal turned back to a liquid and the wafers joined. In a further example, the flowable metal is put into reservoirs 105 and 115, the wafers 100 and 110 are brought together, the flowable metal intermixes between reservoirs 105 and reservoirs 115 and the flowable metal is hardened. In such an example, the flowable metal may be hardened for the first time when the wafers 100 and 110 are clamped together.

As noted above, the flowable metal in reservoirs 105 may have a crown. Accordingly, the flowable metal in reservoirs 115 may not fill the entire reservoir as shown in FIG. 10 in order to allow the reservoirs to be brought together without the overflow of the flowable metal. In embodiments where the crown is omitted, the reservoirs 115 may be completely filled or not completely filled.

Once the wafers 100, 110 are positioned adjacent to each other as shown in FIG. 11, the wafers may be heated to alter the state of the flowable metal in reservoirs 105, 115 from a solid or paste to a liquid. At this point, the flowable metal from reservoirs 105 and 115 intermixes. Once the flowable metal in reservoirs 105, 115 has intermixed, the wafers may be cooled and the flowable metal hardens thereby joining the wafers 100, 110 together at the reservoirs 105, 115. As noted above, the cooling metal will contract to ensure a tight interface between wafers 100, 110 and dies 102, 112 to prevent any warping of the wafers and/or dies away from each other.

As noted, the shape of the reservoirs 105, 115 shown in FIGS. 6-11 is merely one example, and the reservoirs may have a wide variety of other shapes in further embodiments. Examples of such further embodiments are shown in the simplified views of dies 102, 112 from wafers 100, 110 in FIGS. 12-15. In these embodiments, the reservoirs 105 and 115 together form a generally trident-shaped opening, and upon joining and heating the wafers 100, 110, the flowable metal in each reservoir forms a clamp having multiple fingers extending between and joining the wafers 100 and 110. The embodiment of FIGS. 12-13 includes a central portion which may be generally "T"-shaped as described above and left and right fingers which extends upward and then angle inward toward the central portion in one of the reservoirs 105, 115. The embodiment of FIGS. 14-15 includes a central portion which may be generally "T"-shaped as described above and left and right fingers which extend upward into a crossbar to also form generally "T"-shaped reservoir portions.

In each of the above-described configurations, the reservoirs include internal sections buried within the dielectric layer 126 and 136 which have surface components which are parallel to the major surfaces 103 and 113 of the wafers 100, 110. When the flowable metal hardens against these surface components in the respective wafers 100, 110, these surfaces exert forces on the clamping members normal to the major surfaces 103, 113 to prevent separation of the wafers and/or dies.

In addition to aligning the reservoirs together, the crown on the flowable metal in one set of reservoirs ensures that the die bond pads 108 on dies 102 align with die bond pads 118 on dies 112. In embodiments, the die bond pads 108 and 118 may also bond to each other, for example by Cu-to-Cu bonding, though such bonding may be omitted in further embodiments.

Once the wafers are joined together, the wafers may be diced for example in a stealth laser dicing process of step 222. In such an embodiment, with a first of the wafers supported on a chuck (for example wafer 110), laser pulses may be applied to the other wafer (wafer 100 in this example) with the laser energy focused at points between the first and second major surfaces 103, 104 of the wafer 100. The wafer 100 may then be thinned in a backgrind step 224 to provide the final thickness of the wafer 100. Either before or during the backgrind step, cracks develop along the lines defined by the laser points and propagate toward the surfaces 103, 104 along crystalline planes to separate the dies 102 from the wafer 100. A layer of die attach film (DAF) may be applied to the second major surface 104 of the wafer 100 in step 226.

The pair of wafers may then be flipped over with the DAF layer of wafer 100 supported on a chuck, and the stealth laser dicing process and the backgrind process may be performed on wafer 110 to dice the dies 112. The wafers 100 and 110 may be diced by technologies other than stealth laser dicing in further embodiments. The positions of the semiconductor dies 102 and 112 on the respective wafers are mapped so that the vertical and horizontal lines along which the wafer 100 is diced correspond in the same positions to the vertical and horizontal lines along which the wafer 110 is diced.

As noted, in embodiments, the dies 102 may include memory arrays and the dies 112 may include CMOS logic circuits. In such embodiments, the respective pairs of dies 102 and 112 bonded together may form an integrated memory module 120 which functions as a single, complete integrated flash memory, such as for example a BiCS flash memory. Examples of the integrated memory module 120 are shown in FIG. 8 described above, as well as in the edge and perspective views of FIGS. 16 and 17. As shown, once coupled together, the bond pads 106 may remain exposed to enable connection of the integrated memory module 120 to a host device or other components. Thereafter, the integrated memory module 120 may be packaged into a semiconductor device, possibly including multiple integrated memory modules 120.

Figure 18:
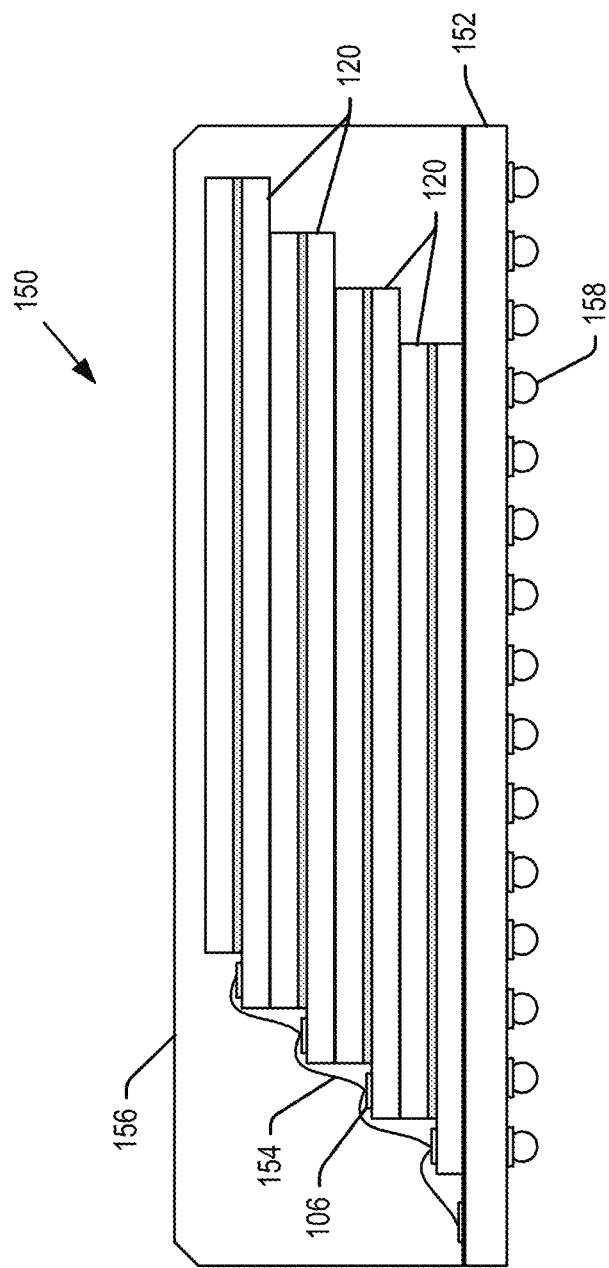
FIG. 18 is an example of a semiconductor device including a number of stacked integrated memory modules according to embodiments of the present technology.

While a wide variety of packaging configurations are known, FIG. 18 shows one such example of a packaged semiconductor device 150. FIG. 18 shows a number of integrated memory modules 120 offset stacked with respect to each other on a substrate 152 so that bond wires 154 may be affixed to the exposed die bond pads 106 on each module 120. The device 150 may be encapsulated in molding compound 156 and may optionally include solder balls 158 to mount the semiconductor device 150 to a host device such as a printed circuit board (PCB).

It may happen that an integrated memory module 120 needs to be disassembled into its respective dies 102, 112, either before or after incorporation into semiconductor device 150. It is a feature of the present technology that the semiconductor dies 102, 112 may be heated so that the metal of the clamping members softens, thereby allowing separation of the dies from each other. These same dies may thereafter again be affixed to each other using the flowable metal in the reservoirs 105, 115 as described above.

In embodiments of the present technology described with respect to FIGS. 1-18, flowable metal may be included in reservoirs on semiconductor wafers and/or dies to affix the wafers and/or dies together. In further embodiments of the present technology, reservoirs or other openings may be formed in the substrates of semiconductor devices comprising signal carrier mediums to join those devices together. Such embodiments will now be described with reference to FIGS. 19-30.

Figure 19:
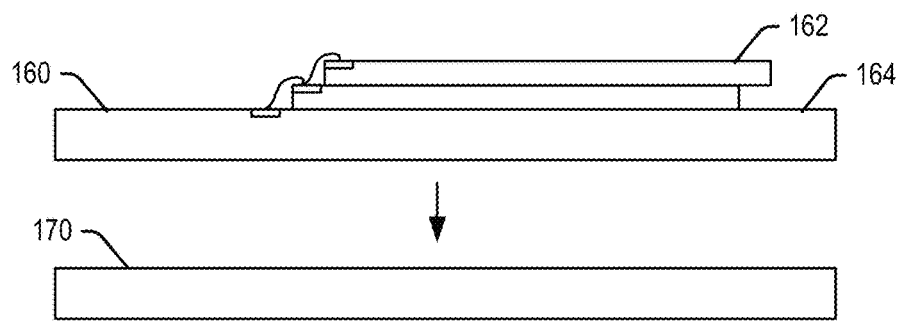
FIG. 19 is an edge view of a semiconductor device to be clamped to an electronic component such as a printed circuit board according to embodiments of the present technology.

Referring initially FIG. 19, there is shown a semiconductor device 160 in the form of a semiconductor package including semiconductor dies 162 mounted to a signal carrier medium 164 which may for example be a substrate. It is understood that the semiconductor device 160 may include different types and numbers of semiconductor dies, as well as other passive and active components known to be included within a packaged semiconductor device. The semiconductor device 160 is to be joined to a second semiconductor device 170 in the form of a signal carrier medium such as for example a PCB. However, the semiconductor device 170 may also be a device similar to device 160, including semiconductor dies and other passive and active components mounted on a signal carrier medium. A PCB is an example of a semiconductor device as used herein, even though a PCB itself may or may not include semiconductor dies.

Figure 20:
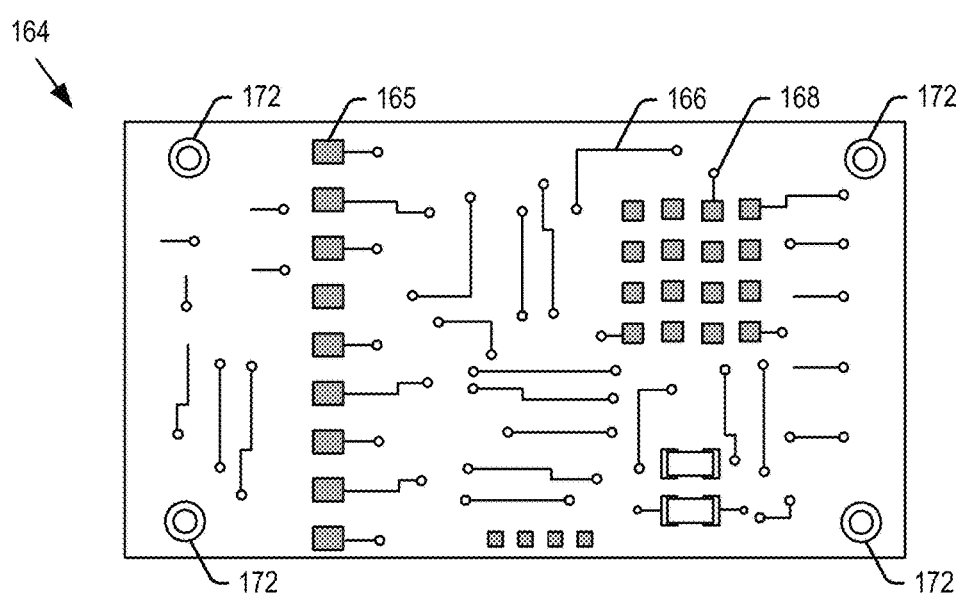
FIGS. 20 and 21 are plan views of a semiconductor device and printed circuit board including reservoirs for receiving a flowable metal to clamp the device and circuit board together according to embodiments of the present technology.

FIG. 20 shows a plan view of the signal carrier medium 164 used in semiconductor device 160. As used herein, a signal carrier medium includes one, two or more conductive layers sandwiching one or more dielectric cores. A signal carrier medium as used herein transfers signals between semiconductor dies mounted thereon and a host device. A signal carrier medium as used herein is not a semiconductor die as used herein.

The signal carrier medium 164, also referred to below simply as substrate 164, includes contact pads 165, traces 166 and vias 168. The traces 166 and vias 168 may be used to transfer signals to and from the contact pads 165. The particular pattern of contact pads 165, traces 166 and vias 168 is shown by way of example only and may vary in further embodiments. The opposed surface of substrate 164 (not shown) may similarly include a pattern of contact pads 165, traces 166 and vias 168.

In accordance with aspects of the present technology, substrate 164 may further include a number of reservoirs 172 for receiving a flowable metal to join the substrate 164 to the electronic component 170 as explained below. FIG. 20 shows four such reservoirs 172 at corners of the substrate 164. However, the substrate 164 may include more or less reservoirs, possibly in other positions, in further embodiments. In embodiments, the positions of reservoirs 172 may be provided so as not to overlap or interfere with the layout of contact pads 165, traces 166 or vias 168.

Figure 21:
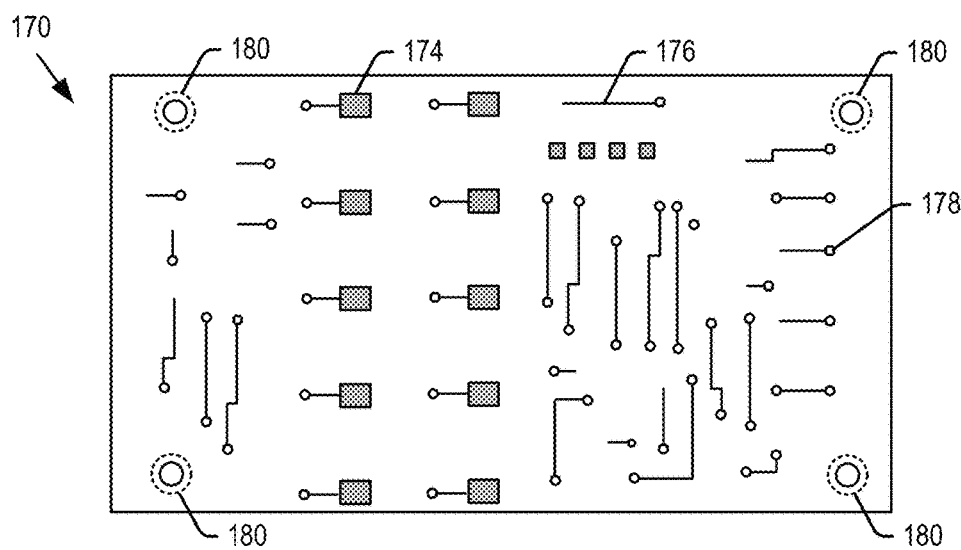

FIG. 21 shows a plan view of the electronic component 170 which in embodiments described below may be a signal carrier medium such as a PCB. The electronic component 170, also referred to below simply as PCB 170, includes contact pads 174, traces 176 and vias 178. The traces 176 and vias 178 may be used to transfer signals to and from the contact pads 174. The particular pattern of contact pads 174, traces 176 and vias 178 is shown by way of example only and may vary in further embodiments. The opposed surface of PCB 170 (not shown) may similarly include a pattern of contact pads on 74, traces 176 and vias 178.

In accordance with aspects of the present technology, PCB 170 may further include a number of reservoirs 180 for receiving a flowable metal to join the PCB 170 to the substrate 164 of semiconductor device 160 as explained below. FIG. 21 shows four such reservoirs 180 at corners of the PCB 170. However, the PCB 170 may include more or less reservoirs, possibly in other positions, in further embodiments. The number and positions of reservoirs 180 in PCB 170 may match the number and positions of the reservoirs 172 in substrate 164. In embodiments, the positions of reservoirs 180 may be provided so as not to overlap or interfere with the layout of contact pads 174, traces 176 or vias 178.

Figure 22:
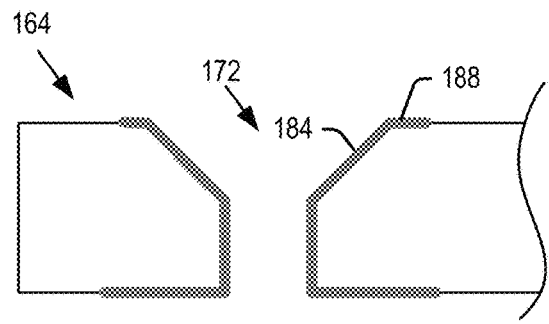
FIGS. 22 and 23 are cross-sectional edge views of different configurations of reservoirs within a semiconductor device according to embodiments of the present technology.
Figure 23:
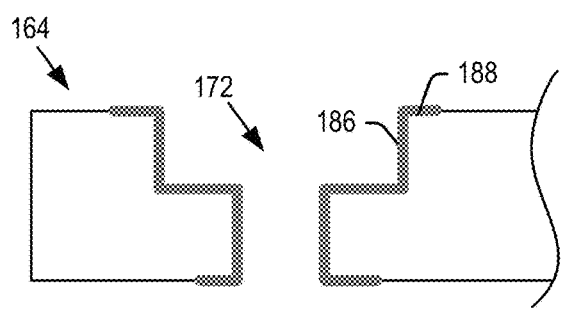

FIGS. 22 and 23 are enlarged cross-sectional views of two possible configurations for a reservoir 172 in substrate 164. In these examples, reservoir 172 is open at both the top and bottom surfaces of substrate 164. An upper section of the reservoir may be defined by sloped walls 184 (FIG. 22), or by square walls 186 (FIG. 23). The upper section of reservoir 172 may have other contours, with such contours including non-vertical surfaces that are able to exert a force normal to the major planar surfaces of the substrate 164 (FIG. 19). A lower section of the reservoir 172 may be narrower than the upper section, and defined by vertical walls (e.g., orthogonal to the major planar surfaces of the substrate 164). The walls of the lower section need not be vertical in further embodiments.

Figure 24:
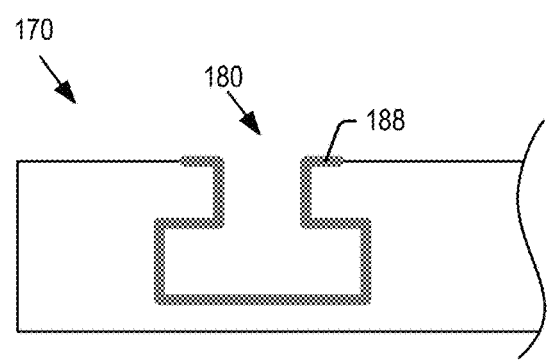
FIGS. 24 and 25 are cross-sectional edge views of different configurations of reservoirs within a printed circuit board according to embodiments of the present technology.
Figure 25:
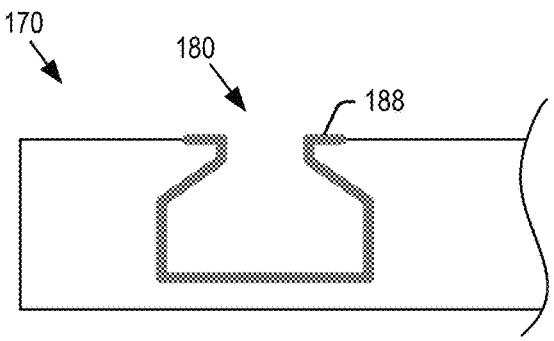

FIGS. 24 and 25 are enlarged cross-sectional views of two possible configurations for a reservoir 180 in PCB 170. In these examples, reservoir 180 is formed partially through the thickness of the PCB 170. In FIG. 24, the reservoir 180 has a generally "T"-shaped cross-section. FIG. 25 is similar, but has slopped sidewalls. The sidewalls of reservoir 180 may have other contours, with such contours including non-vertical surfaces that are able to exert a force normal to the major planar surfaces of the PCB 170 (FIG. 20). A lower section of the reservoir 172 may be narrower than the upper section, and defined by vertical walls (e.g., orthogonal to the major planar surfaces of the PCB 170). The walls of the lower section need not be vertical in further embodiments.

The upper and lower portions of the reservoirs 172, 180 may be formed by various methods, including by drilling, sintering, 3D printing and other techniques. The substrate 164 and/or PCB 170 may also be assembled a layer at a time to facilitate the formation of reservoirs 172 and 180 with different contours through the thicknesses of the substrate and PCB. In embodiments, the sidewalls of the reservoirs 172, 180 may be plated with a layer 188 (shown in a thicker gray line in FIGS. 22-25), though the plating may be omitted in further embodiments.

Referring now to FIGS. 26-28, in order join the substrate 164 with PCB 170, the reservoirs 172 in the substrate 164 may be filled with a flowable metal. In one example, the flowable metal may be a paste that is forced into the reservoirs 172 in substrate 164 with a squeegee 185 as shown in FIG. 26. In such an embodiment, the flowable metal may be solder mixed with solvents that enable the solder to be a paste that can be forced into the reservoirs 172. This same paste may be used for flowable metal used in the embodiments of FIGS. 1-18. The flowable metal in a liquid form may alternatively be poured into reservoirs 172 while the bottom portions of the reservoirs 172 are closed off until the liquid metal hardens into a solid. In such embodiments, the flowable metal may be solder which is heated until molten and then flows, is poured, is injected or is otherwise placed within the reservoirs 172. This same liquid may be used for the flowable metal used in the embodiments of FIGS. 1-18. The flowable metal may further alternatively be filled into the reservoirs 172 by any other method described herein.

In the embodiments described above, the flowable metal fills the reservoirs 172. Where the flowable metal is applied to the reservoirs 172, the flowable liquid may be hardened by cooling, or otherwise cured to a solid. Where the flowable metal is applied as a paste, it may also be hardened by cooling, drying or otherwise cured to a solid. With the flowable metal in the reservoirs 172 in a hardened state, the substrate 164 may be shipped by itself and/or stored, and thereafter affixed to the PCB 170. In this example, the flowable liquid is hardened in the substrate 164, brought together with the PCB 170, and then the flowable liquid is again converted to a flowable form where it flows from reservoirs 172 into reservoirs 180. Thereafter, the flowable metal is hardened again. In a further example, the flowable metal is put into reservoirs 172, the substrate 164 and PCB 170 are brought together, the flowable metal flows from reservoirs 172 into reservoirs 180 and the flowable metal is hardened. In such an example, the flowable metal may be hardened for the first time when the substrate 164 and PCB 170 are clamped together.

As in the above-described embodiments, where the flowable metal is initially a liquid, it may be hardened by cooling or otherwise cured, heated back into a liquid to join or separate the substrate and PCB, and then hardened back into a solid. This conversion of the flowable metal between a liquid and a solid may occur multiple times. Where the flowable metal is initially a paste, it may be hardened by cooling, drying or otherwise cured. Thereafter, the hardened material may be converted to a liquid metal for example by heating the flowable metal to evaporate the solvents which aided in making the initial paste. Thereafter, the conversion of the flowable metal between a liquid and a solid may occur multiple times.

After the reservoir is filled with the flowable metal, the substrate 164 may be positioned on top of the PCB 170 with the reservoirs 172, 180 aligned with each other as shown in FIG. 27. As in earlier embodiments, the flowable metal may be formed with a crown protruding from the bottom of the substrate 164 to aid in alignment of the substrate 164 with the PCB 170, though the crown may be omitted in further embodiments.

Once the substrate 164 and PCB 170 are positioned adjacent to each other as shown in FIG. 27, the flowable metal in reservoirs 172 may be heated to alter the state of the flowable metal from a solid or paste to a liquid. At this point, the flowable metal flows from reservoirs 172 into reservoirs 180 as shown in FIG. 28. The flowable liquid may flow into reservoirs 180 by capillary action and/or gravity. Once the flowable metal has flowed into reservoirs 180, the flowable metal may be cooled to form a hardened clamping member joining the substrate 164 and PCB 170 together.

The configuration of the flowed and hardened metal shown in FIG. 28 is by way of example only, and may be different in further examples. However, in general, a portion of the flowed and hardened metal remains in the enlarged portions of reservoirs 172, a portion of the flowed and hardened metal has entered the enlarged base part of reservoirs 180, and a portion of the flowed and hardened metal remains in the narrower surface portions of reservoirs 172, 180. Thus, the hardened metal in the reservoirs 172, 180 forms a clamp firmly joining the substrate 164 and PCB 170 together. Moreover, as the flowed metal cools, it contracts. This ensures a strong clamping force at the interface between substrate 164 and PCB 170. This strong clamping force ensures the substrate 164 and PCB 170 are held together tightly, and prevents warping of the substrate and/or PCB which can otherwise occur in conventional affixation techniques.

In the embodiments described above, reservoirs 172 in substrate 164 have the flowable metal which flows into empty reservoirs 180 in PCB 170. In further embodiments, this may be reversed, so that reservoirs 180 have the flowable metal which flows into empty reservoirs 172 in substrate 164.

In the embodiment described above, the reservoir 172 is filled with the flowable metal before the substrate 164 is positioned on the PCB 170. In further embodiments, the substrate 164 may be positioned on the PCB 170, and then flowable metal in liquid or paste form may be poured into both the reservoirs 172 of substrate 164 and the reservoirs 180 of PCB 170. The flowable metal in the reservoirs may then cool to bond the substrate and PCB together. In this embodiment, the flowable metal may be placed in reservoirs 172 and 180 and the flowable metal may then be hardened to allow the substrate 164 and/or PCB 170 to be shipped or stored. Thereafter, the substrate 164 and PCB 170 may be brought together, the flowable metal turned back to a liquid and the substrate and PCB joined. In a further example, the flowable metal is put into reservoirs 172 and 180, the substrate 164 and PCB 170 are brought together, the flowable metal intermixes between reservoirs 172 and reservoirs 180 and the flowable metal is hardened. In such an example, the flowable metal may be hardened for the first time when the substrate 164 and PCB 170 are clamped together.

Figure 29:
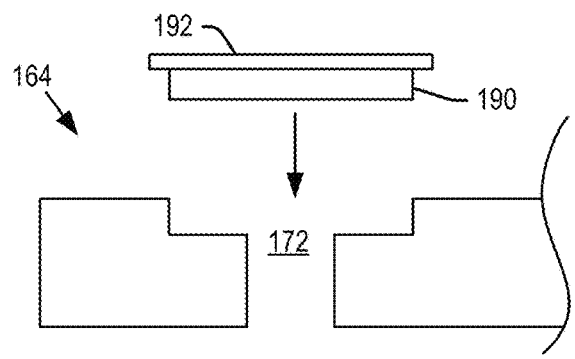
FIGS. 29-31 are cross-sectional and top views of an anchor for use within the reservoirs according to embodiments of the present technology.
Figure 30:
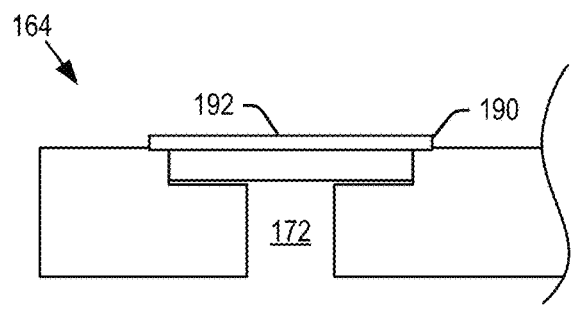
Figure 31:
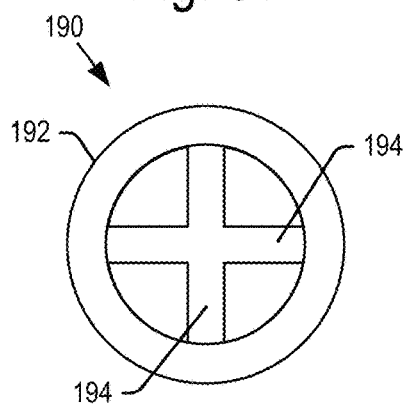

In embodiments, the hardened metal in reservoirs 172, 180 forms a clamping member affixing the substrate 164 and PCB 170 together. However, in further embodiments, additional anchors may be used to add further structural rigidity to the clamping member formed by the hardened flowable metal. FIGS. 29-31 show an anchor 190 configured to fit within the reservoir 172 in the substrate 164. The anchor 190 may include a top cap 192 fixing the anchor in place within reservoir 172. The flowable metal may flow around crossbars 194 of the anchor 190 so that, when the flowable metal hardens around the crossbars, the anchor 190 forms part of the clamping member and adds additional strength to the clamping member. A similar anchor may be fit for the reservoir 180 of the PCB 170.

Figure 32:
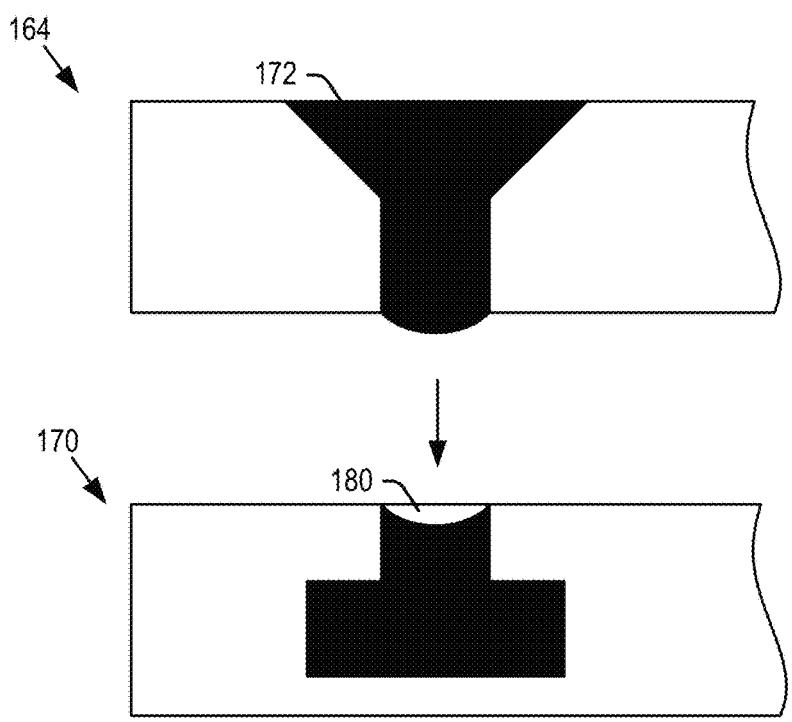
FIG. 32 is an enlarged cross-sectional edge view of reservoirs for clamping a semiconductor device to an electronic component such as a printed circuit board according to alternative embodiments of the present technology.
Figure 33:
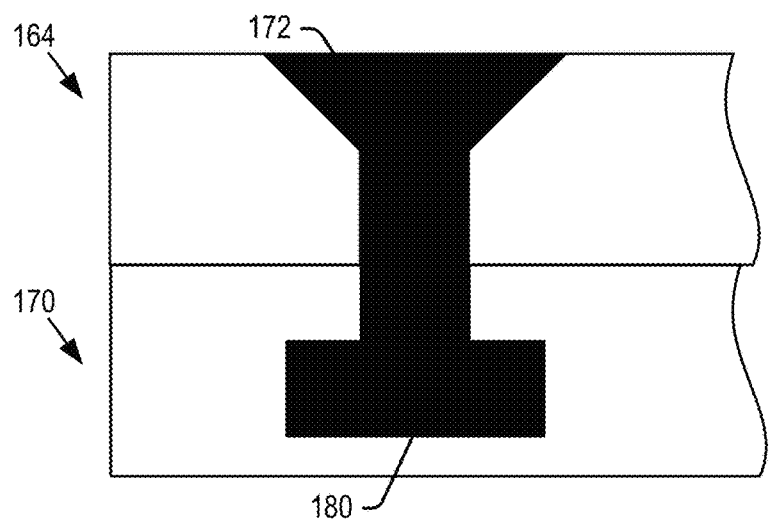
FIG. 33 is an enlarged cross-sectional edge view of reservoirs clamping a semiconductor device to an electronic component such as a printed circuit board according to alternative embodiments of the present technology.

FIGS. 32 and 33 are views of reservoirs 172, 180 according to an alternative embodiment of the present technology. In particular, in this embodiment, reservoirs 180 may also be at least partially filled with the flowable metal used in reservoirs 172. The flowable metal may be added into reservoirs 180 by any of the above-described methods for adding the flowable metal to reservoirs 172.

As noted above, the flowable metal in reservoirs 172 may have a crown. Accordingly, the flowable metal in reservoirs 180 may not fill the entire reservoir as shown in FIG. 32 in order to allow the reservoirs to be brought together without the overflow of the flowable metal. In embodiments where the crown is omitted, the reservoirs 180 may be completely filled or not completely filled.

Once the substrate 164 and PCB 170 are positioned adjacent to each other as shown in FIG. 33, the flowable metal in reservoirs 172, 180 may be heated to alter the state of the flowable metal from a solid or paste to a liquid. At this point, the flowable metal from reservoirs 172 and 180 intermix. Once the flowable metal in reservoirs 172, 180 has intermixed, the flowable metal may be cooled and hardened, thereby joining the substrate 164 and PCB 170 together. As noted above, the cooling metal will contract to ensure a tight interface between substrate 164 and PCB 170 to prevent any warping of the substrate 164 and/or PCB 170.

Figure 34:
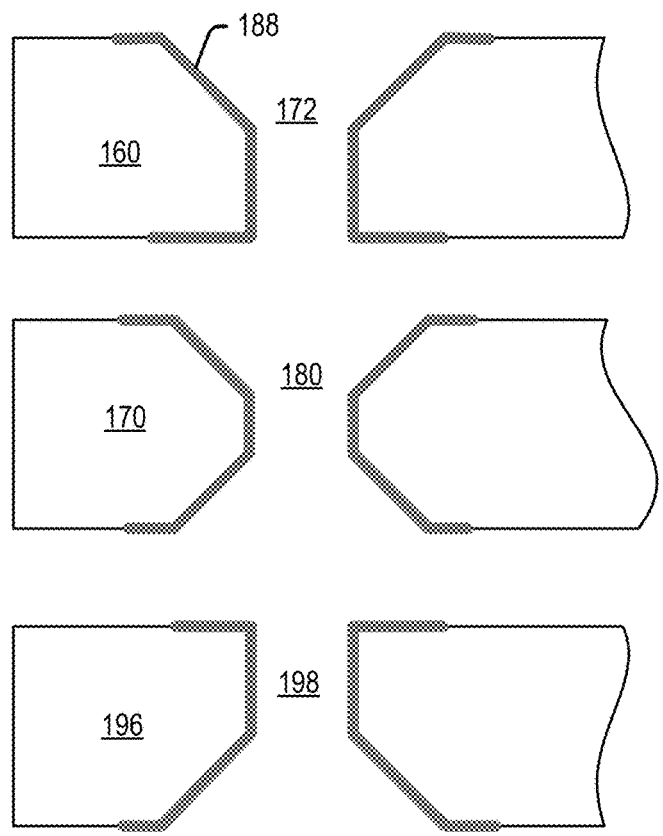
FIG. 34 is an enlarged cross-sectional edge view of reservoirs for clamping three separate devices together according to alternative embodiments of the present technology.

In embodiments described above, flowable metal within a pair of adjoining reservoirs may be used to clamp two devices together. However, it is understood that the present technology may be used to clamp together more than two devices. For example, FIG. 34 shows three devices to be affixed to each other. The first two may be the semiconductor device 160 including substrate 164 and the PCB 170 described above. The third device 196 may be another electronic component including for example another semiconductor device similar to device 160, or other PCB similar to PCB 170.

As shown, the three reservoirs 172, 180 and 198 in the respective devices to be affixed may all be formed in the devices so as to align with each other when the devices are stacked. In this embodiment, the reservoir 172 in the semiconductor device 160 may be as described above. In this embodiment, the reservoir 180 in the PCB 170 may be as described above, except that it is open through the entire PCB 170. In this embodiment, the reservoir 198 in device 196 may be similar to reservoir 172 described above but inverted relative to reservoir 172. The devices may be plated with plating 188 as described above, or the plating may be omitted.

Figure 35:
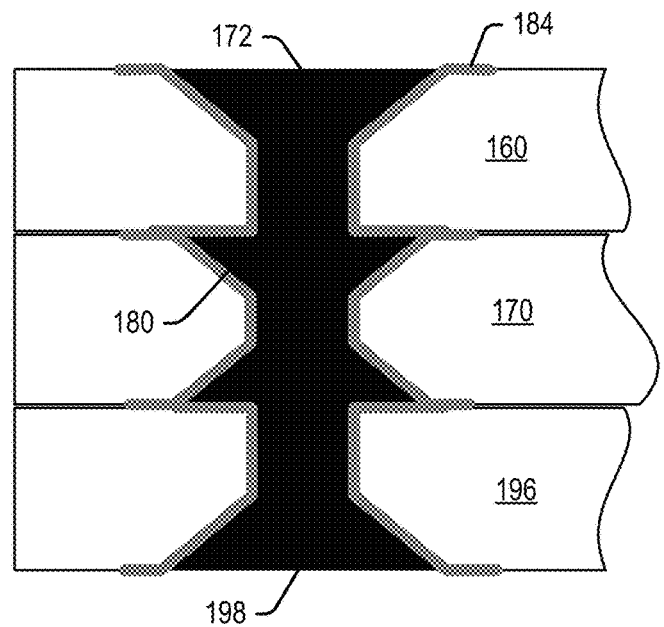
FIG. 35 is an enlarged cross-sectional edge view of reservoirs clamping together three separate devices according to alternative embodiments of the present technology.

The flowable metal may be inserted into one or more of the reservoirs 172, 180, 198 prior to (or after) the devices 160, 170 and 196 being aligned with each other. As described above, the flowable metal may be applied as a paste, or as a liquid with a bottom of the reservoirs sealed off until liquid metal hardens. The three devices 160, 170 and 196 may be brought together as shown in FIG. 35 and the liquid metal heated until it intermixes and/or flows into all of the reservoirs 172, 180, 198 and hardens upon cooling. The reservoirs 172, 180, 198 in each of the devices 160, 170 and 196 includes surfaces capable of opposing a normal force to the major surfaces of the devices so that, once the flowable metal hardens, it can firmly hold the devices 160, 170 and 196 together. As noted, the contraction of the cooling metal further provides for a tight interface between each of the devices.

As with the earlier embodiment, it is an advantage of the present technology used to affix two or more of devices 160, 170 and 196 together that two or more of the devices may be separated after being clamped together by heating the liquid metal. Thereafter, the devices may be reattached to each other using the liquid metal in the reservoirs as described above.

In summary, an example of the present technology relates to a semiconductor wafer, comprising: first and second opposed major surfaces; a dielectric layer adjacent the first major surface; integrated circuits formed in the dielectric layer; bond pads in the first major surface, the bond pads electrically coupled to the integrated circuits; and a set of one or more reservoirs formed in the dielectric layer and open at the first major surface, the set of one or more reservoirs configured to receive a flowable metal to clamp the semiconductor wafer to a second semiconductor wafer upon hardening of the flowable metal in the set of one or more reservoirs.

In a further example, the present technology relates to a semiconductor die, comprising: first and second opposed major surfaces; a dielectric layer adjacent the first major surface; integrated circuits formed in the dielectric layer; bond pads in the first major surface, the bond pads electrically coupled to the integrated circuits; and a set of one or more reservoirs formed in the dielectric layer and open at the first major surface, the set of one or more reservoirs configured to receive a flowable metal to clamp the semiconductor die to a second semiconductor die upon hardening of the flowable metal in the set of one or more reservoirs.

In another example, the present technology relates to a semiconductor device, comprising: a signal carrier medium comprising first and second opposed major surfaces; and a set of one or more reservoirs formed in the signal carrier medium and open to at one of the first and second major surfaces, the set of one or more reservoirs configured to receive a flowable metal to clamp the semiconductor device to a second semiconductor device upon hardening of the flowable metal in the set of one or more reservoirs.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor wafer, comprising:
   first and second opposed major surfaces, the first surface defining a first direction parallel to the first surface, and a second direction between the first and second opposed major surfaces;
   a dielectric layer adjacent the first major surface;
   integrated circuits formed in the dielectric layer;
   bond pads in the first major surface, the bond pads electrically coupled to the integrated circuits; and
   a set of one or more reservoirs formed in the dielectric layer and open at the first major surface, the set of one or more reservoirs configured to receive a flowable metal to clamp the semiconductor wafer to a second semiconductor wafer upon hardening of the flowable metal in the set of one or more reservoirs, a reservoir of the set of one or more reservoirs comprising:
      a first section having a first sub-section extending in the first direction, and a second sub-section extending in the second direction, and
      a second section having a third sub-section extending in the first direction and a fourth sub-section extending in the second direction,
      wherein the first and second sections are connected to each other through one or more additional sections formed in the second semiconductor wafer.

2. The semiconductor wafer of claim 1, wherein a reservoir from the set of one or more reservoirs comprises a base section distal from the first major surface and a neck section more proximal to the first major surface than the base section, and wherein the base section is wider than the neck section.

3. The semiconductor wafer of claim 1, wherein the set of one or more reservoirs extend to a depth partially through a depth of the dielectric layer.

4. The semiconductor wafer of claim 1, wherein the set of one or more reservoirs are positioned so as not to interfere with positions of the integrated circuits and bond pads.

5. The semiconductor wafer of claim 1, further comprising a semiconductor die comprising the integrated circuits, wherein the set of one or more reservoirs comprise a plurality of reservoirs surrounding a footprint of the semiconductor die.

6. The semiconductor wafer of claim 1, further comprising a semiconductor die comprising the integrated circuits, wherein the set of one or more reservoirs comprise one or more reservoirs within a footprint of the semiconductor die.

7. The semiconductor wafer of claim 1, further comprising a metal within the set of one or more reservoirs, wherein the metal is configured to be a liquid or paste at a first temperature and a solid at a second temperature lower than the first temperature.

8. The semiconductor wafer of claim 7, wherein the metal is configured to fill at least a portion of a first reservoir of the set of one or more reservoirs in the wafer, and to at least partially fill a second reservoir of the second wafer, the first and second reservoirs aligned with each other, to clamp the wafer to the second wafer when the metal is at the second temperature.

9. The semiconductor wafer of claim 7, wherein the metal is configured to contract when moving from the first temperature to the second temperature to pull the wafer and the second wafer tightly together.

10. The semiconductor wafer of claim 1, wherein the integrated circuits comprise one of memory arrays and CMOS logic circuits, and wherein the second wafer comprises the other of the memory arrays and CMOS logic circuits.

11. A semiconductor die, comprising:
    first and second opposed major surfaces;
    a dielectric layer adjacent the first major surface;
    integrated circuits formed in the dielectric layer;
    bond pads in the first major surface, the bond pads electrically coupled to the integrated circuits; and
    a set of one or more reservoirs formed in the dielectric layer and open at the first major surface, the set of one or more reservoirs configured to receive a flowable metal to clamp the semiconductor die to a second semiconductor die upon hardening of the flowable metal in the set of one or more reservoirs, a reservoir of the set of one or more reservoirs comprising:
       a first "T"-shaped section having a first sub-section extending in a first direction, and a second sub-section extending in a second direction orthogonal to the first direction, and
       a second section having a third sub-section extending in the first direction and a fourth sub-section extending in the second direction,
    wherein the first and second sections are connected to each other through one or more additional sections formed in the second semiconductor wafer.

12. The semiconductor die of claim 11, wherein the integrated circuits are in an active area of the semiconductor die, and wherein the set of one or more reservoirs comprise a plurality of reservoirs in one or more borders around the active area.

13. The semiconductor die of claim 11, wherein the integrated circuits are in an active area of the semiconductor die, and wherein the set of one or more reservoirs comprise a one or more reservoirs in the active area of the die.

14. The semiconductor die of claim 11, wherein a reservoir from the set of one or more reservoirs comprises a base section distal from the first major surface and a neck section more proximal to the first major surface than the base section, and wherein the base section is wider than the neck section.

15. A semiconductor device, comprising:
    a signal carrier medium comprising first and second opposed major surfaces, the first surface defining a first direction parallel to the first surface, and a second direction between the first and second opposed major surfaces; and
    a set of one or more reservoirs formed in the signal carrier medium and open to at one of the first and second major surfaces, the set of one or more reservoirs configured to receive a flowable metal to clamp the semiconductor device to a second semiconductor device upon hardening of the flowable metal in the set of one or more reservoirs, a reservoir of the set of one or more reservoirs comprising:
       a first section having a first sub-section extending in the first direction, and a second sub-section extending in the second direction, and
       a second section having a third sub-section extending in the first direction and a fourth sub-section extending in the second direction, wherein the first and second sections are connected to each other through one or more additional sections formed in the second semiconductor wafer.

16. The semiconductor device of claim 15, wherein one of the semiconductor device and second semiconductor device is a printed circuit board, and the other of the semiconductor device and second semiconductor device is a semiconductor package comprising one or more semiconductor dies.

17. The semiconductor device of claim 15, further comprising a metal within the set of one or more reservoirs, wherein the metal is configured to be a liquid or paste at a first temperature and a solid at a second temperature lower than the first temperature.

18. The semiconductor device of claim 17, wherein the metal is configured to fill at least a portion of a first reservoir of the set of one or more reservoirs in the semiconductor device, and to at least partially fill a second reservoir of the second semiconductor device, the first and second reservoirs aligned with each other, to clamp the semiconductor device to the second semiconductor device when the metal is at the second temperature.

19. The semiconductor wafer of claim 18, further comprising a third semiconductor device comprising a third set of one or more reservoirs, the metal flowing into a reservoir of the third set of one or more reservoirs to clamp the third semiconductor device to the semiconductor device and the second semiconductor device when the metal is at the second temperature.

\* \* \* \* \*